United States Patent
Ito

(10) Patent No.: US 7,957,950 B2
(45) Date of Patent: Jun. 7, 2011

(54) HARD/SOFT COOPERATIVE VERIFYING SIMULATOR

(75) Inventor: Noriyoshi Ito, Chiba (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 499 days.

(21) Appl. No.: 12/039,005

(22) Filed: Feb. 28, 2008

(65) Prior Publication Data

US 2009/0222250 A1 Sep. 3, 2009

(51) Int. Cl.
*G06G 7/62* (2006.01)
*G06F 17/50* (2006.01)

(52) U.S. Cl. ............................ 703/17; 703/14; 703/22

(58) Field of Classification Search .................. 703/14, 703/22, 17, 19
See application file for complete search history.

(56) References Cited

U.S. PATENT DOCUMENTS

| | | | | |
|---|---|---|---|---|
| 6,188,975 | B1 * | 2/2001 | Gay | 703/22 |
| 6,490,545 | B1 * | 12/2002 | Peng | 703/13 |
| 7,117,139 | B2 * | 10/2006 | Bian | 703/13 |
| 2005/0149897 | A1 * | 7/2005 | Yamashita et al. | 716/18 |
| 2005/0209840 | A1 * | 9/2005 | Baklashov et al. | 703/22 |
| 2005/0228627 | A1 * | 10/2005 | Bellantoni et al. | 703/13 |
| 2006/0149526 | A1 * | 7/2006 | Torossian et al. | 703/16 |

FOREIGN PATENT DOCUMENTS

JP 2005-293219 10/2005
JP 2008204006 A * 9/2008

* cited by examiner

*Primary Examiner* — Jason Proctor
*Assistant Examiner* — Aniss Chad
(74) *Attorney, Agent, or Firm* — Volentine & Whitt, P.L.L.C.

(57) ABSTRACT

A hard/soft cooperative verifying simulator is based on a SystemC simulator, and provides the capability of reducing overhead of context switching control thereby to shorten processing time. Time keepers for controlling simulation times of a plurality of threads are provided corresponding to the threads generated as simulation models for hardware and software. Each of the time keepers has a variable which holds a simulation time for each thread, a variable which holds a summation time, and a break request queue which stores a break time and its corresponding break method therein. The time keeper manages both variables and the queue in response to six types of method invocations from the thread, and invokes a wait function of the SystemC simulator when necessary. It is thus possible to reduce the number of times that a wait function invocation is performed, and shorten the entire processing time.

8 Claims, 13 Drawing Sheets

SIMULATOR SHOWING EMBODIMENT OF THE PRESENT INVENTION

SIMULATOR SHOWING EMBODIMENT OF THE PRESENT INVENTION

INTERRUPT CONTROL ON CPU FROM PERIPHERAL DEVICE (5)

HARD/SOFT COOPERATIVE VERIFYING SIMULATOR

BACKGROUND OF THE INVENTION

The present invention relates to a C language-based hard/soft cooperative verifying simulator for speeding up logic verification at hardware design and system level design and cooperative verification of hardware and software.

A simulator using an HDL (Hardware Description Language) has heretofore been used for cooperative verification for verifying a real-time OS (Operation System), device drivers and software task operations comprising applications/programs and the like on a simulation model in which operations of CPUs (Central Processing Units), memories, buses, peripheral devices, etc. of a built-in system. Since, however, the simulator using the HDL is difficult to provide speed-up, there has been proposed and used a simulator of a system level using a C language-based model description language such as described in, for example a patent document 1 [(Japanese Unexamined Patent Publication No. 2005-293219) and refer to a patent document 2 (Japanese Unexamined Patent Publication No. 2006-23852) and a non-patent document 1 (Open SystemC Initiative, "SystemC 2.0.1 Language Reference Manual", Revision1.0)]. With speeding-up of simulation, pre-verification of a system level including software is enabled before detailed design of hardware and the design of LSI (Large Scale Integration circuit) are completed.

The normal C language encounters difficulties in realizing simulations on which delay times of hardware and the number of execution cycles of a CPU are reflected. Therefore, a hardware model description language such as SpecC, SystemC or the similar language has been proposed and put forward for standardization.

In a SystemC simulator, processes operated in parallel in smaller module units, called Threads each capable of being started from one task placed during start-up have been realized. wait functions for controlling the simulation times have been prepared for the SystemC simulator. The wait function advances the simulation time managed by the simulation kernel (body) of the SystemC simulator by an elapsed time given as an argument for a wait function invocation and performs context switching control between the threads being executed in parallel. Incidentally, the context designates the state of a processor that is executing a simulation. Context switching means that the context of each thread under execution is switched to that of another thread.

Thus, when a cooperative verifying simulation is done using the SystemC simulator, the threads that perform parallel operations are sequentially switched and controlled by the wait functions, thereby making it possible to perform the verification of a system level including software.

In the cooperative verifying simulation using the SystemC simulator, however, the context switching control between the threads is performed each time the wait functions are invoked. Therefore, the overhead increases due to the frequently-executed context switching control, thus resulting in a reduction in simulation speed.

SUMMARY OF THE INVENTION

The present invention has been made in view of the foregoing. It is therefore an object of the present invention to provide a hard/soft cooperative verifying simulator based on a SystemC simulator, capable of reducing overhead of context switching control thereby to shorten a simulation time.

According to one aspect of the present invention, for attaining the above object, there is provided a C language-based hard/soft cooperative verifying simulator for performing cooperative verification of hardware and software, comprising a plurality of time keepers provided every plurality of threads constituting simulation models corresponding to the hardware and software and each provided with a first variable for holding a simulation time, a second variable for holding a summation time, a break request queue for storing break requests, each of which consists of a break time and a break method, corresponding thereto therein, and a processing function in order to control a simulation time of each of the threads to which said time keepers correspond respectively; and a C language-based simulator body which advances each managed system time by a given required time in response to a request issued from each of the time keepers and controls context switching between the threads being executed in parallel.

In the present invention, there are provided time keepers each including a first variable for holding a simulation time of each thread, a second variable for holding a summation time, a break request queue for storing break requests, each of which consists of a break time and a break method, corresponding thereto, and a processing function, every plurality of threads that constitute simulation models. Thus, the present invention brings about advantageous effects in that since the simulation time of each thread is managed by its corresponding time keeper, the frequency with which each wait function of a simulator body is invoked decreases, and the overhead of context switching control with the wait function invocation is reduced, thereby shortening the simulation time.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The above and other objects and novel features of the present invention will become more completely apparent from the following descriptions of preferred embodiments when the same is read with reference to the accompanying drawings. The drawings, however, are for the purpose of illustration only and by no means limitative of the scope of the invention.

First Preferred Embodiment

Figure 1:
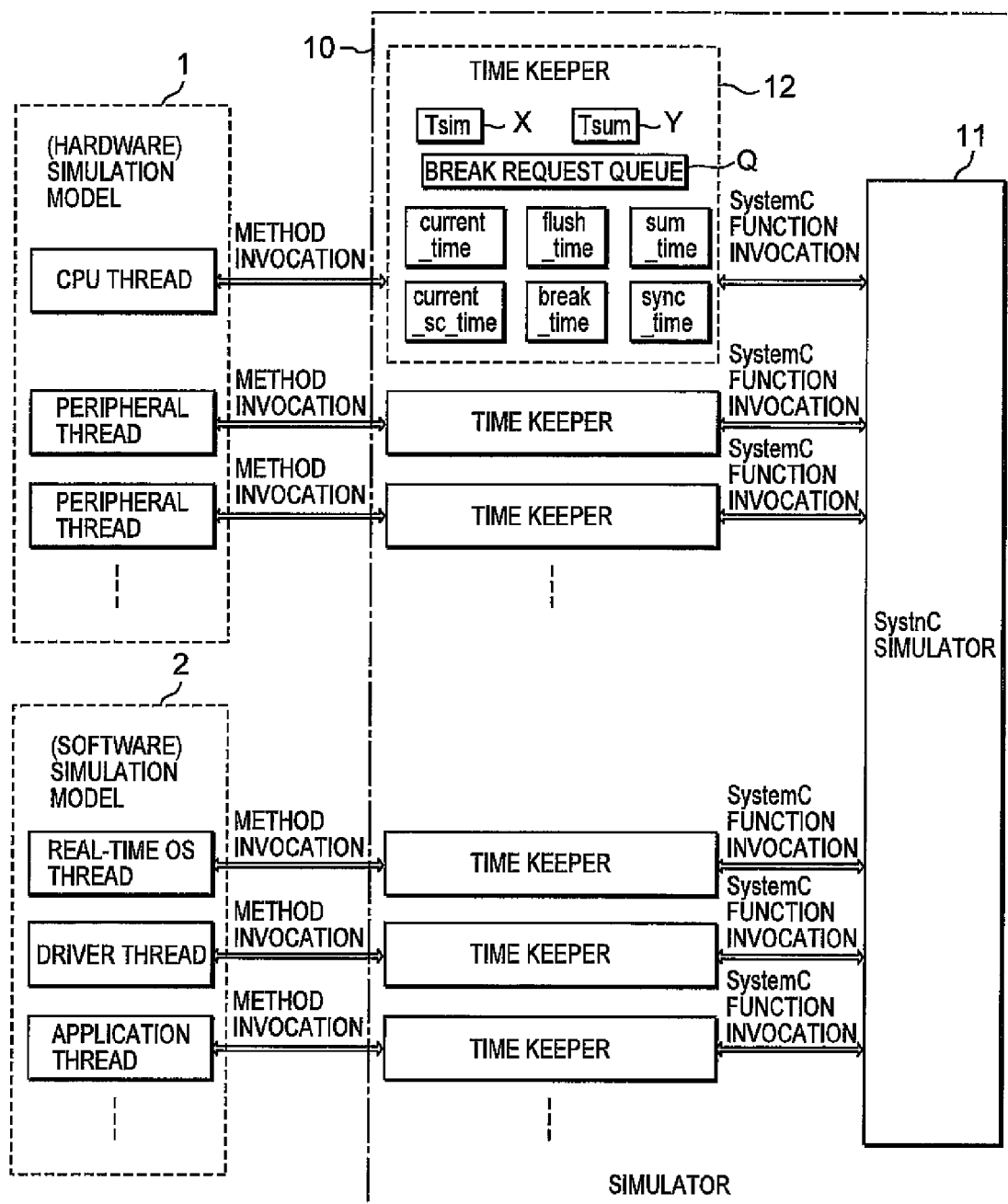
FIG. 1 is a configuration diagram of a simulator showing an embodiment of the present invention.

FIG. 1 is a configuration diagram of a simulator showing a first embodiment of the present invention.

The simulator 10 performs cooperative verification of hardware and software with a SystemC simulator as a base and is configured as one in which a plurality of time keepers 12 are provided in a stage prior to a conventional SystemC simulator 11.

A simulation model 1 of hardware and/or a simulation model 2 of software are connected to the simulator 10.

The simulation model 1 of the hardware is equivalent to one obtained by modeling functions of a CPU and various peripheral devices in a SystemC language every sequentially-executed CPU and peripheral devices. The simulation model 1 comprises a plurality of threads created every device. In this configuration, an ISS (instruction set simulator) is utilized as a CPU model usually, where the ISS simulates the CPU behavior executing compiled codes of software programs on instruction by instruction basis, in which the compiled codes consist of sequences of CPU readable instruction codes. Because simulation speed of the ISS is relatively slow, an alternative way is to use more abstract software simulation model 2 instead of the ISS, where the software simulation model 2 is generated by converting the software programs to be executed on the CPU into a set of threads or tasks. The resulting simulation model 2 of the software is constituted of a plurality of threads obtained by converting programs such as a real-time OS, device drivers, application programs, etc. described in a C language to SystemC models using a tool described in the patent document 1, for example. The CPU thread included in the hardware model 1, in this case, could be replaced by the simulation model 2 to speed up simulation.

Each of the time keepers 12 is provided to control each simulation time of every sequentially-executed device or program. Since execution control between tasks is sequentially performed at the CPU under a plurality of multitask environments, for example, one time keeper 12 which manages simulation times of the CPU on a unified basis, is prepared. On the other hand, the time keepers 12 are prepared every thread for implementing respective sequentially-executed state machines as for such devices that the state machines are operated in parallel.

The time keepers 12 prepared corresponding to threads of the respective devices and programs are channel-connected and can be referred to as needed via channel-connected ports from the respective threads.

Each of the time keepers 12 has a variable X that holds a simulation time Tsim, a variable Y that holds an integration or summation time Tsum, a break or interruption request queue Q that stores break requests, each of which consists of a break method corresponding to a break time, and six methods comprising a current_time method, a current_sc_time method, a flush_time method, a break_time method, a sum_time method and a sync_time method.

The current_time method (first function) is a function that returns the current simulation time Tsim as a returned value.

The current_sc_time method (second function) is a function that returns the value of (Tsim−Tsum) equivalent to a simulation time (hereinafter called system time Tsys) managed by a kernel of the SystemC simulator.

The flush_time method (third function) is a function that calls or invokes a wait function of the SystemC simulator with the summation time Tsum as an argument and thereafter clears the summation time Tsum to zero. Incidentally, a flush means zero clear.

The break_time method (fourth function) is a function that registers a break time bTsim, a break system time bTsys and a break method given as arguments in the corresponding break request queue Q of each time keeper as break requests. Here, the break method indicates a function invoked where the simulation time Tsim reaches the break time bTsim or more in the sum_time method. Since a plurality of bus masters are adapted to the same peripheral device where the break methods each corresponding to the break time are registered, they are managed as the break request queue Q. The smallest break time is stored at the head of the break request queue Q and stored in the order in which the break times increase. Incidentally, the contents of the break request queue Q are set empty upon initialization.

The sum_time method (fifth function) is a function that performs the following processing in accordance with the state of the break request queue Q.

When the break request queue Q is empty, an elapsed time, given as an argument of the sum_time method call, is added to the simulation time Tsim to advance the simulation time Tsim. Further, the elapsed time is added to the summation time Tsum to update the summation time Tsum.

When the break request queue Q is not empty, different processing is performed depending on the relationship between the simulation time Tsim and the break time bTsim for a head break request in the break request queue Q.

When the simulation time Tsim is less than the break time bTsim, the elapsed time is added to the simulation time Tsim to advance the simulation time Tsim. When the updated simulation time Tsim is smaller than the break system time bTsys, the summation time Tsum is cleared to zero. If not so, then the summation time Tsum is set to the value of (Tsim−bTsys).

When the simulation time Tsim reaches the break time bTsim or more, the summation time Tsum is set to the value of (Tsim−bTsys) and the break method is invoked over or with respect to all break requests at each of which the break time bTsim is the simulation time Tsim or more. Thereafter, these break requests are deleted from the queue Q. Afterwards, the elapsed time is added to the simulation time Tsim to advance the simulation time Tsim. Further, the elapsed time is also added to the summation time Tsum to update or renew the summation time Tsum.

The sync_time method (sixth function) is a function that compares a simulation time sTsim given as an argument and the current simulation time Tsim of the corresponding time keeper and invokes the corresponding sum_time method with the difference between the sTsim and the updated Tsim as an argument where Tsim<sTsim. Thus, the simulation time Tsim is updated to the value of the sTsim, and the summation time Tsum is updated to the value of (Tsum−sTsim−Tsim). Incidentally, when Tsim≧sTsim, the sum_time method is not invoked.

The summation time Tsum indicates a time of difference between the simulation time Tsim updated by the corresponding time keeper 12 and the system time Tsys updated by a wait function invocation of the SystemC simulator 11. Thus, when a flush_time method is invoked and the summation time Tsum is cleared to zero, the simulation time Tsim and the system time Tsys coincide with each other. When the break request queue Q is empty, the sum_time method updates the summation time Tsum by a value obtained by adding together the summation time Tsum and the elapsed time.

In the simulator 10, each device advances the simulation time by making a tik->sum_time method invocation to a time keeper tik of the device without advancing the simulation time by invoking the wait function of the SystemC simulator 11, where the operator '->' means to refer a member method of its right side from an object pointer of its left side. The above case of 'tik->sum_time' method invocation means that the sum_time method pointed to by the time keeper tik object pointer is invoked.

When it is desired to switch control to other device, a tik->flush_time method invocation is made to the corresponding time keeper tik of the device being executed currently. Thus, the wait function of the SystemC simulator 11 with the summation time Tsum of the time keeper tik as an argument is invoked. With this wait function invocation, the system time Tsys of each device being executed, which has been managed within the kernel of the SystemC simulator 11 is advanced by a time interval designated by the summation time Tsum. Further, context switching control under which control is passed or transferred to the corresponding device smallest in system time Tsys, of executable devices, is performed.

When it is necessary to synchronize the simulation times between the devices, the sync_time method invocation is performed. When the simulation time of a time keeper dtik of a given device is set to the current simulation time of a time keeper stik of other device, a dtik->syn_time(stik->current_time method) method invocation is performed. That is, the current simulation time sTsim of the time keeper stik is determined by sTsim=stik->current_time method invocation. With the sTsim as an argument, the dtik->sync_time method invocation is performed to set the simulation time of the time keeper dtik to sTsim.

When a break time bTsim, a break system time bTsys and a break method are registered in the time keeper dtik of the device as break requests, a tik->break_time method invocation is performed. Thus, when the simulation time of a time keeper tik has reached the break time bTsim or more before a tik->sum_time method invocation is made at the time keeper tik to update the simulation time, a break method defined within a TikIF class is invoked. When the flush_time method is designated as the break method, context switching control on other device is performed by this break method invocation.

The operation of the simulator 10 shown in FIG. 1 will be explained below using specific examples. Incidentally, a simulation description language in the following description is based on the SystemC language.

(A) Function of sum_time Method

Control on a simulation time at each device is realized by performing a sum_time method invocation on a time keeper corresponding to the device.

In order to channel-connect the CPU and the time keeper ctik, for example, the following CPU class is defined at the SystemC simulator.
class cpu:public sc_module

```
class cpu:public sc_module
{
public:
    sc_port<tikIF,0>ctik /* port to CPU Time Keeper */
    SC_CTOR(CPU){
    SC_THREAD(main);
    }
    void main(void)
}
```

Here, tikIF indicates an interface definition for defining a method function of a time keeper. This is defined in the following manner, for example:
class tikIF:public sc_interface{
  public:
  virtual void break_time(uint64 bTsim,uint64 bTsys,void (TikIF::*method)( ))=0;
  virtual void flush_time(void)=0;
  virtual void sum_time(long time)=0;
  virtual uint64 current_time(void)=0;
  virtual void sync_time(uint64 sTsim)=0;
};

The following description at the above-described CPU class definition means that any number of channels each having a tikIF interface are connectable to tik ports.
sc_port<tikIF,0>ctik; /* port to CPU Time Keeper */

The following description at the CPU class definition means that a main function is started as a CPU thread upon the start of simulation.
SC_CTOR(CPU){
  SC_THREAD(main);
}

The connection between the CPU and the time keeper ctik is performed at an upward hierarchy of these class definitions in the following manner:
cpu=new cpu("cpu"); /* generate CPU */
ctik=new tik("ctik"); /* generate CPU time keeper */
cpu->tik(*ctik); /* connect CPU time keeper to CPU */

Which time keeper connected to the tik port of the CPU should be referred to, is designated like tik[0], tik[1], . . . in the order in which the time keepers are connected at the upward hierarchy. A data type tid_t of a time keeper identifier for designating which time keeper should be referred to, is defined in the following manner, for example:

```
typedef enum{C_TID=0,P_TID=1, ...
} tid_t;
```

He the C_TID and P_TID respectively indicate time keeper identifiers of the CPU and the peripheral device, for example. Thus, if the time keepers are connected to the tik ports like the time keepers of the CPU, the time keepers of the peripheral device in numerical order of the time keeper identifiers defined at tid_t, then tik[C_TID] refers to the corresponding time keeper of the CPU, and tik[P_TID] refers to the corresponding time keeper of the peripheral device.

Since only the time keeper ctik is connected to the CPU upon the connection of each time keeper to the CPU at the above upward hierarchy, only access via the tik[C_TID] port is enabled. Thus, a method invocation of the time keeper ctik of the CPU can be performed via the tik[C_TID] port from the main thread of the CPU.

Figure 2:
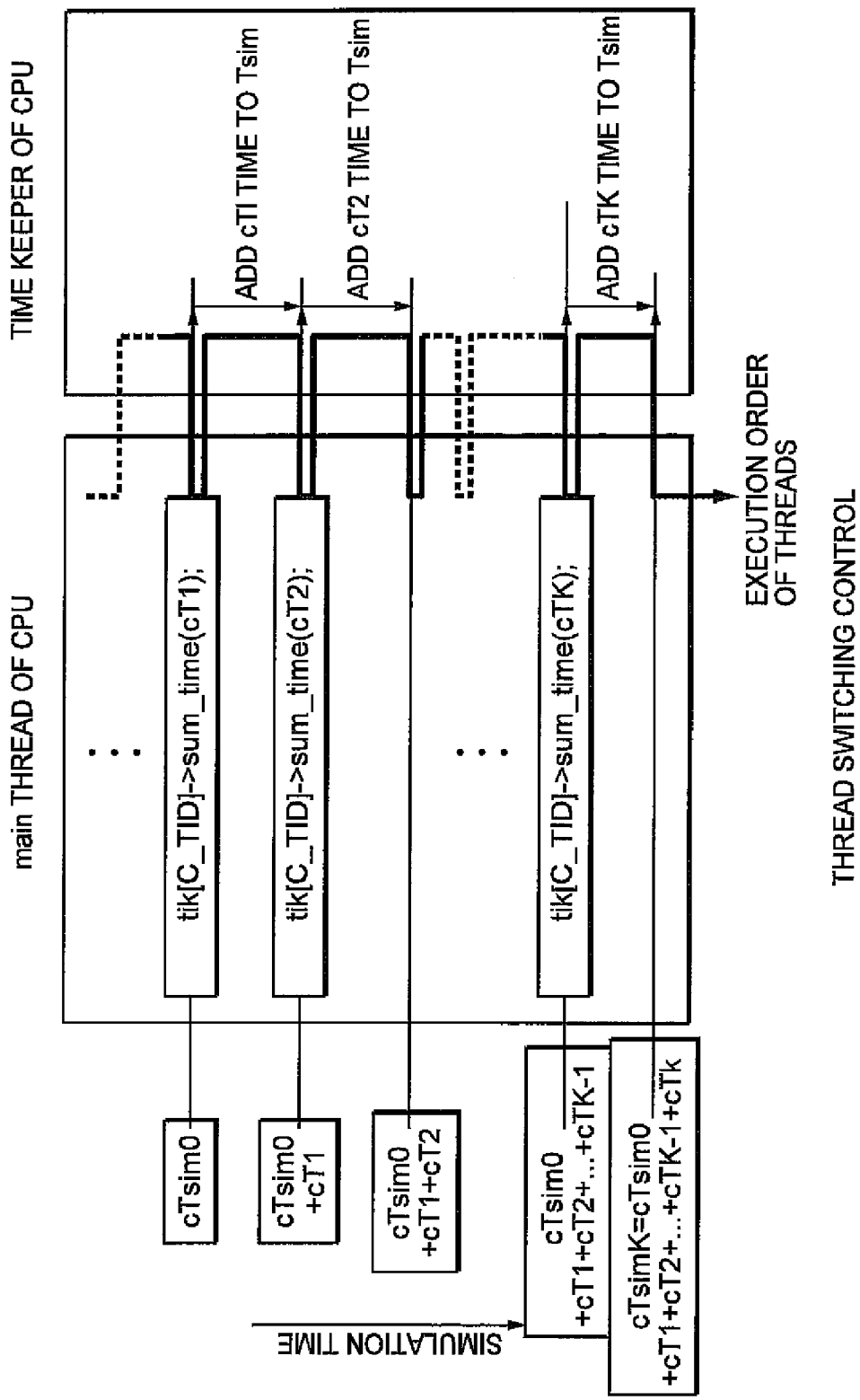
FIG. 2 is a diagram for describing main thread switching control of a CPU.

FIG. 2 is a diagram for describing main thread switching control of the CPU. The vertical axis indicates simulation time.

Elapsed times cT1, cT2, ..., cTK respectively indicate instruction execution times at the CPU. When, for example, an instruction set simulator is used as a CPU model, they assume execution times taken for respective instructions to be executed. In this case, a main thread function of the CPU is defined as follows:
void CPU:: main (void){

```
void CPU::main(void){
    tik[C_TID]->sum_time(cT1);
    tik[C_TID]->sum_time(cT2);
    ...
    tik[C_TID]->sum_time(cTK);
}
```

The main thread of the CPU invokes tik[C_TID]->sum_time(cT1), tik[C_TID]->sum_time(cT2), ..., tik[C_TID]->sum_time(cTK) methods via their corresponding ctik ports and thereby advances the simulation time Tsim. When the CPU thread invokes a tik[C_TID]->sum_time(cTi) method with an i-th elapsed time cTi as an argument as shown in the figure, the value of cTi is added to the corresponding summation time Tsum and simulation time Tsim at the sum_time method of ctik.

A summation time cTsumK and a simulation time cTsimK subsequent to the tik[C_TID]->sum_time(cTK) method invocation are given by the following equations:

$$cTsumK = cT1 + cT2 + \ldots + cTK$$

$$cTsimK = cTsum0 + cTsumK = cT0 + cT1 + cT2 + \ldots + cTK$$

Here, cTsum0 indicates a simulation time prior to the invocation of the tik[C_TID]->sum_time(cT1) method. Thus, the simulation time control in the thread is performed by the sum_time method invocation of the time keeper without being performed by the wait function invocation of the SystemC simulator, whereby the context switching control between the threads is omitted and simulation is hence speeded up.

(B) Synchronous Control Between Threads

Under a cooperative verification environment between hardware and software, a CPU, memories and each peripheral device are connected via a bus. Processing is brought forward or advanced while the software and each peripheral device operated on the CPU are being operated in cooperation with each other. As for devices connected to the bus, there are known a bus master capable of starting the transfer of data to the bus actively, and a bus slave which waits for a bus request passively. Normally, the CPU functions as a bus master to output a data transfer bus request and obtains access to a memory and a peripheral device each corresponding to a bus slave via the bus, thereby advancing processing. A description will now be made of an example in which a model of data transfer made via a bus is modeled at a transaction level.

When a bus request is issued from the bus master, a bus usage grant is obtained by a bus arbiter and thereafter access to the corresponding bus slave is performed. The renewal of the simulation time where the access to the bus slave is performed is made to the corresponding time keeper of the bus master. In order to identify to which time keeper of bus master the simulation time control may be made on the bus slave side, an identifier for the time keeper of the bus master is added to a method that performs the bus request as an argument.

When, for example, the CPU functions as the bus master and obtains an access grant to the corresponding peripheral device used as the bus slave, the peripheral device invokes a tik[C_TID]->sum_time(Tacc) method over the time keeper ctik of the CPU to advance the simulation time of the CPU. Here, Tacc indicates the time required to access the peripheral device. That is, the access time Tacc of the peripheral device is added to the simulation time of the CPU by this method invocation so that the simulation time of the CPU is advanced.

When the CPU functions as the bus master and obtains an access grant to the corresponding peripheral device via the bus and starts a thread operation of the peripheral device, the execution of software at the CPU and the operation of hardware at the peripheral device are performed in parallel after the corresponding thread of the peripheral device has started. That is, simulation time control using each time keeper of the CPU and simulation time control using each time keeper of the peripheral device are performed independently after the start-up of the peripheral device.

In this case, it is necessary to synchronize the start-up time of the thread of the peripheral device to the start-up time of the peripheral device by the CPU and bring the simulation time of the peripheral device into sync with that of the CPU. The sync_time method is prepared for this purpose. The peripheral device takes out the simulation time of each time keeper of the CPU by the current_time method upon starting its thread and performs a sync_time method invocation on the time keeper of the peripheral device with the taken-out simulation time as an argument, thereby setting the simulation time.

In order to perform such synchronization control on the simulation time, there is a need to channel-connect both time keepers of the CPU and the peripheral device to the peripheral device. Therefore, the following peripheral device class pdev is defined in a manner similar to the CPU:
class pdev: public sc_module

```
class pdev: public sc_module
{
public:
    sc_port<tikIF,0>tik;  /* port for time keeper access */
    sc_port<busIF>bus;    /* port for bus access */
    SC_CTOR(pdev){
        SC_THREAD(main);
    }
}
```

Similarly, the class of a bus bus is defined, and the connections between the CPU and the corresponding peripheral device pdev and between the time keeper ctik of the CPU and the corresponding time keeper Ptik of the peripheral device pdev, and the connection to the bus bus are performed at an upward hierarchy in the following manner:
cpu=new cpu("cpu"); /* generate CPU */
pdev=new pdev("pdev"); /* generate peripheral device */
bus=new bus("bus"); /* generate bus */
ctil=new tik("ctik"); /* generate CPU time keeper */
ptic=new tik("ptik"); /* generate peripheral-device time keeper */
cpu->bus(*bus); /* connect bus to CPU */
cpu->tik(*ctik); /* connect CPU time keeper to CPU */ bus->pdev->(*pdev); /* connect peripheral device to bus as slave */
bus->tik(*ctik); /* connect CPU time keeper to bus */
bus->tik(*ptik); /* connect peripheral-device time keeper to bus */
pdev->bus(*bus); /* connect bus to peripheral device */
pdev->tik(*ctik); /* connect CPU time keeper to peripheral device */
pdev->tik(*ptik); /* connect peripheral-device time keeper to peripheral device. */

In this case, the CPU time keeper ctik is first connected to the bus bus and a time keeper port of the peripheral device pdev. Next, the peripheral-device time keeper pdev is connected thereto. Accordingly, the time keeper ctik can be referred to by tik[0](i.e., tik[C_TID]). Next, the time keeper ptik can be referred to by tik[1] (i.e., tik[P_TID]). Thus, it is possible to invoke both methods of the CPU time keeper ctik and the peripheral-device time keeper ptik from the bus and the peripheral device.

A description will be made of, for example, a case in which a data write transfer write method is defined for the bus and the peripheral device and the CPU performs a bus->write method invocation for performing writing into a register of each peripheral device via the bus, thereby starting or activating the peripheral device. Here, an address of the peripheral device register is given as a first argument of this write method call, and write data are given by the second argument of this method call, and a time keeper identifier C_TID of the CPU is given as the third argument of this method call. Since the CPU functions as a bus master in this case, the corresponding time keeper of the bus master having executed the write method assumes ctik.

Figure 3:
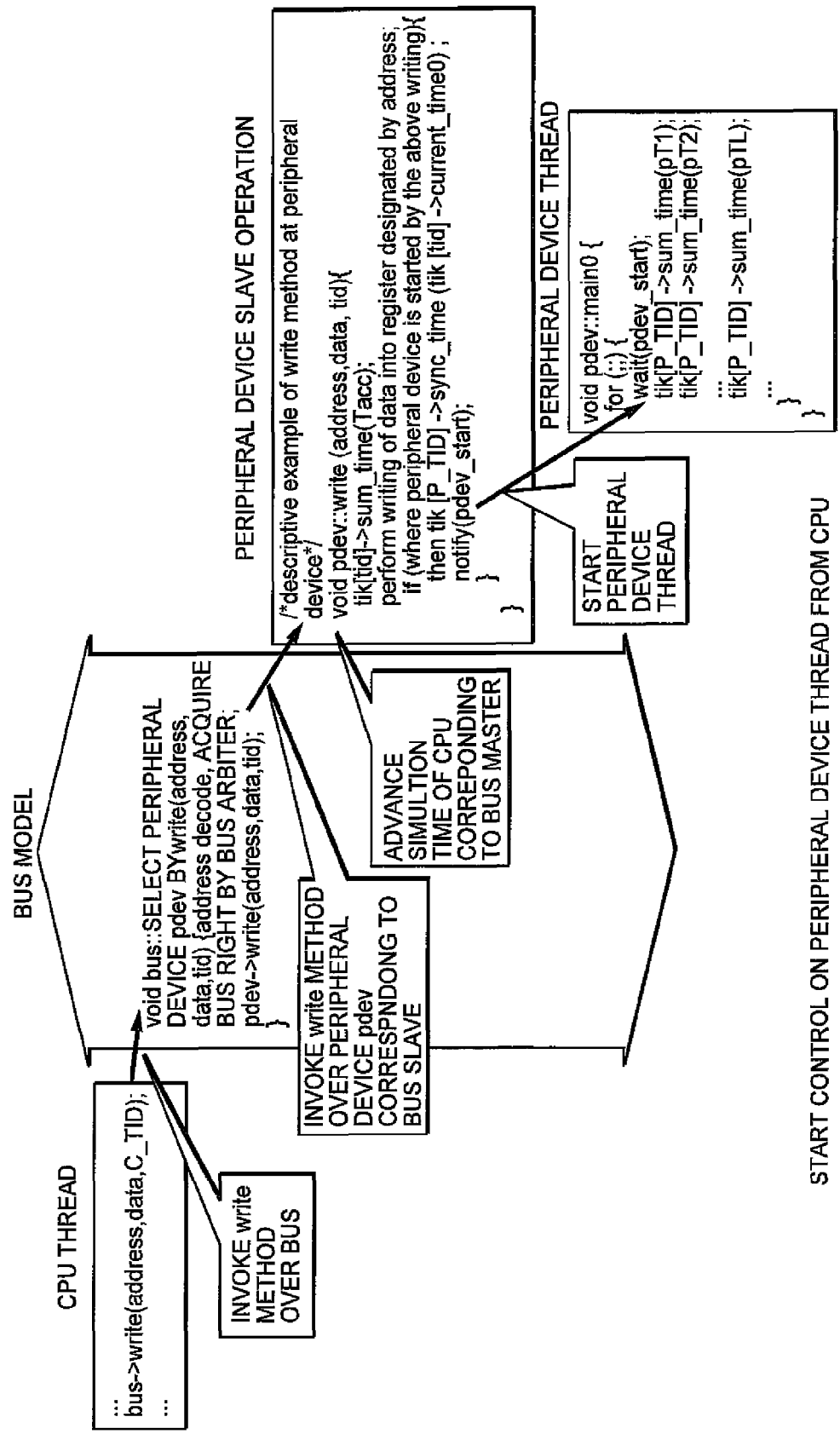
FIG. 3 is a diagram for describing activation control of a peripheral device thread from the CPU.

FIG. 3 is a diagram for describing start-up control on a peripheral device thread from the CPU. As shown in FIG. 3, a CPU thread performs a bus->write(address,data,C_TID) method invocation and thereby starts up a bus model. A descriptive example of a write method at the bus model is as follows:

```
void bus::write(long address, long data, tid_t tid){
    to decode address to select peripheral device pdev
    obtain bus access right by bus arbiter;
    pdev->write(address,data,tid);
}
```

Here, tid indicates a time keeper identifier of a bus master that has requested a bus access. In this case, it assumes the time keeper identifier C_TID of the CPU given by the bus->write(address,data,C_TID) method invocation. According to this write method, the address, given as the first argument of his method call, is first decoded to select the corresponding peripheral device pdev, and the bus usage grant is obtained by the bus arbiter. Thereafter, a pdev->write(address,data,tid) method invocation is performed on the peripheral device pdev, thereby writing data, given as the second argument of this method call, into the corresponding register designated by the address.

A descriptive example of a slave operation of a peripheral thread is as follows:

```
/*descriptive example of write method at peripheral device*/
void pdev::write(long address,long data,tid_t tid){
    tid[tid]->sum_time(Tacc);
    to perform writing of data into register designated by address;
    if (where peripheral device is started by the above writing){
        tik[P_TID]->sync_time(tik[tid]->current_time( ));
        notify(pdev_start);
    }
}
```

After the CPU has acquired the bus usage grant by the bus arbiter as described above, it is necessary to perform a sync_time method invocation before the start-up of a main thread of the peripheral device pdev and set the simulation time of the corresponding time keeper of the peripheral device to the simulation time sTsim at which the CPU has completed writing.

The peripheral device advances the simulation time of the CPU by the access time designated by Tacc through a tid[tid]->sum_time(Tacc) method invocation. When write processing from the CPU is completed, an sTsim=tik[tid]->current_time method invocation is first performed to determine the current simulation time sTsim of the CPU, and a tik[P_TID]->sync_time(sTsim) method is invoked over the time keeper ptik of the peripheral device to set the simulation time of the peripheral device to the simulation time sTsim of the CPU.

Thereafter, the thread of the peripheral device is started up or activated by a notify (event) function invocation of the SystemC simulator. Here, a notify (event) function call starts a thread operation of a thread waiting for an event designated by a wait (event) function call where such a thread exists.

The main thread of the peripheral device pdev is described in the following manner, for example:

```
void pdev::main( ){
    for(;;){  /* repeat the following processing */
        Wait(pdev_start); /* wait until notify(pdev_start) is executed */
        tik[P_TID]->sum_time(pT1); /* add elapsed time pT1 to simulation time of ptik */
        tik[P_TID]->sum_time(pT2); /* add elapsed time pT2 to simulation time of ptik */
        ...
        tik[P_TID]->sum_time(pTL); /* add elapsed time pTL to simulation time of ptik */
    }
}
```

After the thread of the peripheral device has been started up, it waits for a pdev_start event through a wait(pdev_start) function invocation. This waiting state is released when the notify(pdev_start) function invocation for the write method at the peripheral device is performed.

Thus, after the thread of the peripheral device has been started, the CPU may need processing for confirming the operating condition of the peripheral device. In order to confirm the operating condition of the peripheral device, there are two methods if divided broadly: such polling that the CPU reads the contents of a specific register (e.g., status register) of the peripheral device, and such an interruption that each peripheral device gives an interrupt notification to the CPU.

(C) Polling

Polling is realized by allowing the peripheral device to modify the contents of a specific register according to its operating condition and allowing the CPU to invoke a read method for reading the contents of this specific register.

Figure 4:
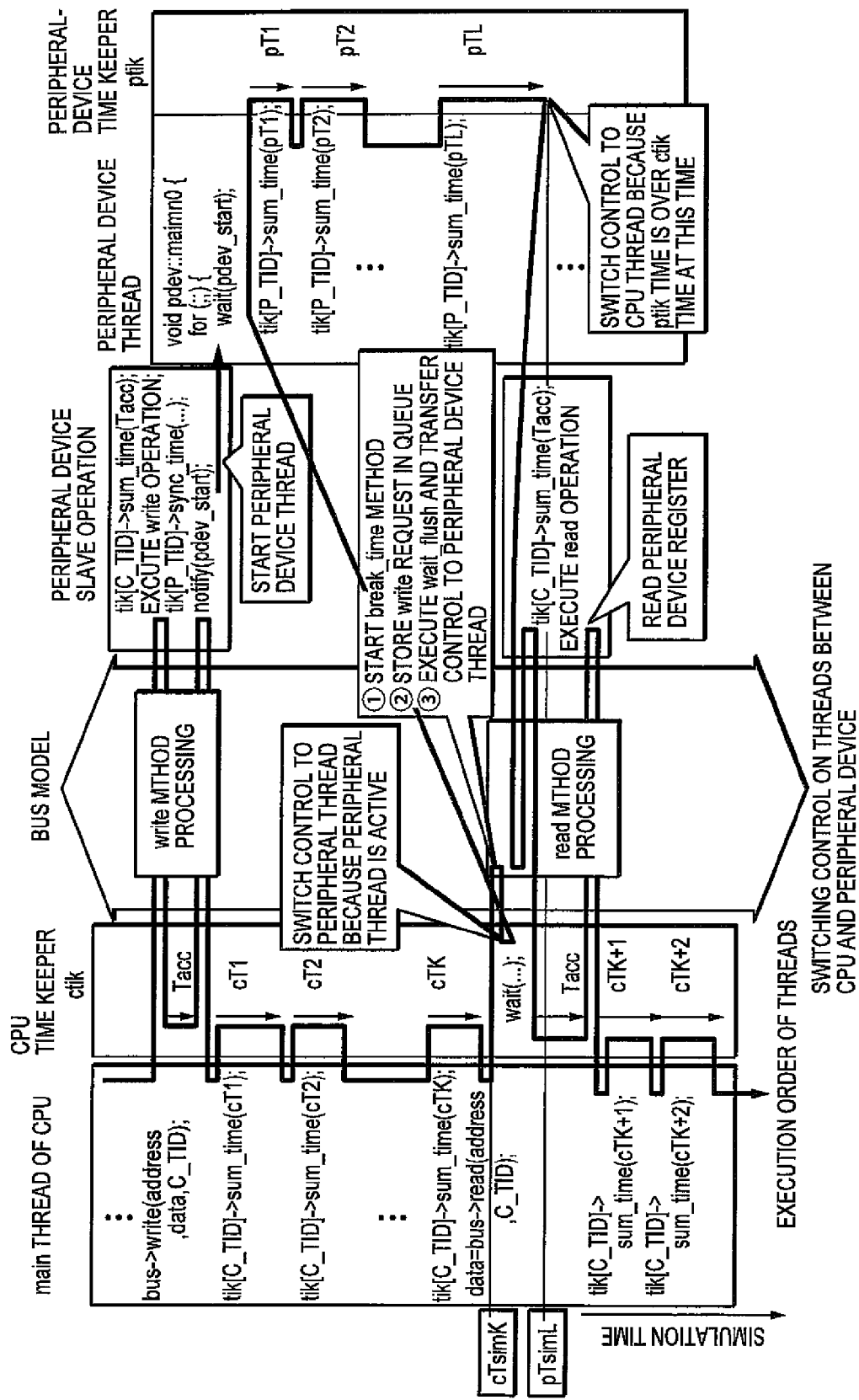
FIG. 4 is a diagram for describing switching control on threads between the CPU and a peripheral device by polling.

FIG. 4 is a diagram for describing switching control on each thread between the CPU and its corresponding peripheral device by polling.

The present example shows the case where after the main thread of the peripheral device pdev has been started up, the simulation time is advanced in the order of elapsed times pT1, pT2, . . . , pTL. Here, the elapsed times pT1, pT2, . . . , pTL respectively indicate processing times at the peripheral device. When, for example, each peripheral device is implemented as a state machine, these elapsed times assume staying time intervals of respective states.

The main thread of the peripheral device invokes tik[P_TID]->sum_time(pT1),tik[P_TID]->sum_time (pT2), . . . , tik[P_TID]->sum_time(pTL) methods over its time keeper ptik. A summation time pTsumL and a simulation time pTsimL subsequent to the invocation of the tik[P_TID]->sum_time(pTL) method are respectively given by the following equations:

$$pTsumL = pT1 + pT2 + \ldots + pTL$$

$$pTsimL = pTsum0 + pTsumL = pT0 + pT1 + pT2 + \ldots + pTL$$

Here, pTsum0 indicates the simulation time prior to the invocation of the tik[P_TID]->sum_time(pT1) method.

The CPU reads a bus->write method for starting the corresponding peripheral device thread and thereafter advances the simulation time in the order of elapsed times cT1, cT2, . . . , cTK.

Assuming now that after a main thread of the CPU has performed a tik[C_TID]->sum_time(cTK) method invocation, a bus->read(address,C_TID) method invocation is performed and the contents of the register of the peripheral device are read. A read method has, as arguments, an address of the register, given as the first argument of this method call, to perform reading, and a time keeper identifier of a bus master, given as the second argument of this method call, having executed the read method, and returns the read data as a returned value. Since the main thread of the CPU functions as the bus master in this case, the time keeper identifier of the bus master having executed the read method assumes C_TIK.

Assume that the simulation time of a time keeper ctik subsequent to the tik[C_TID]->sum_time(cTK) method invocation at the main thread of the CPU is defined as cTsimK, and the following relationship is established.

$$pTsim0 + (pT1 + pT2 + \ldots + pTL - 1) \leq cTsimK \leq pTsimL = pTsim0 + (pT1 + pT2 + \ldots + pTL)$$

In this case, the bus arbiter performs a break_time method invocation on the time keeper of the peripheral device with the simulation time of the CPU, system time thereof and flush_time method as arguments as shown below, and registers it as a break request. Thus, when the simulation time of the peripheral device has reached that of the CPU, which has been set as a break time, the flush_time method corresponding to a break method is invoked.

tik[P_TID]->break_time(tik[C_TID]->current_time( )
  ,tik[C_TID]->current_sc_time( )
  ,&TikIF::flush_time);
tik[C_TID]->flush_time( );

The break_time method first performs current_time method and current_sc_time method invocations on the time keeper of the CPU, which is designated by the time keeper identifier C_TID and thereby determines the current simulation time cTsimK and system time Tsys of the CPU respectively. The cTsimK and Tsys are respectively registered as a break time and a break system time with respect to the time keeper ptik of the peripheral device. The corresponding break method at this time means the flush_time method relative to the time keeper ptik of the peripheral device.

Upon the flush_time method invocation for the time keeper ctik of the CPU, which is executed after the break_time method invocation, the wait function invocation of the SystemC simulator is performed to make context switching to other thread, whereby control is transferred or passed to the other thread. With the invocation of the flush_time method, control is transferred to the peripheral device thread, where processing subsequent to a wait(notify) method invocation by the peripheral device thread is executed.

The peripheral device thread examines whether the simulation time reaches the value cTsimK of the break time set by the break_time method from the CPU or more upon the tik[P_TID]->sum_time(pT1), tik[P_TID]->sum_time (pT2), . . . , tik[P_TID]->sum_time(pTL) method invocations. When the simulation time of the time keeper ptik of the peripheral device does not reach the value cTsimK of the break time, the execution of the peripheral device thread is continued. When the simulation time thereof reaches the cTsimK or more, i.e., the simulation time reaches pTsimL, the time keeper ptik invokes the corresponding break method to switch control to the corresponding CPU thread. Consequently, processing subsequent to the bus->read method invocation of the CPU thread is executed. With such control, the bus->read method invocation of the CPU thread is executed in sync with the simulation time of the peripheral device thread.

(D) Bus Arbiter Operation

A plurality of bus masters may be connected to the bus. This corresponds to a case in which when the bus is shared between a plurality of CPUs, for example, a peripheral device which can be configured as each bus master like a DMAC (Direct Memory Access Controller), is connected to the bus. In such a case, a bus arbiter for arbitrating bus requests between the bus masters is required.

When the bus requests are simultaneously issued from the different bus masters, the bus arbiter selects a bus master of highest priority, based on priority determination or criterion conditions designated in advance according to bus specs and assigns a bus usage grant to the bus master. As the priority determination conditions, a method for setting fixed priority to each bus master, a method for round-robin circulating priorities between the bus masters, etc. are used.

The bus master to which the bus usage grant is assigned obtains access right to the corresponding bus slave using the bus. While such a bus master is using the bus, the other bus masters requesting bus accesses are in a state of waiting for the bus usage grant.

In order to realize such a bus arbitration function, the respective bus masters are materialized as independent threads at each simulation model, and time keepers are prepared for the respective bus masters. Each of the bus masters performs a read/write method invocation on the bus arbiter with its time keeper as an argument thereby outputting a bus request.

When the bus request is issued, the bus arbiter performs bus arbitration in accordance with the following procedures of steps (1) through (6).

(1) The bus arbiter decodes and discriminates each address given as an argument for the bus request to determine the corresponding bus slave to be accessed. The bus arbiter performs a break_time method invocation on a time keeper of the bus slave with a time keeper identifier m_tid of the bus master as an argument as shown below. Thus, the simulation time of the bus master is registered as a break time bTsim of the time keeper of the bus slave. The corresponding method at this time is of a flush_time method for the time keeper of the bus slave. A descriptive example of this operation is shown below. Decode address and determine time keeper identifier s_tid of bus slave;
tik[s_tid]->break_time(tik[m_tid]->current_time( )
,tik[m_tid]->current_sc_time( )
,&TikIF::flush_time);

(2) The bus request, timer keeper identifier and simulation time of each bus master are stored in a bus request queue provided inside the bus arbiter.

(3) A flush_time method is executed on the corresponding time keeper designated by the time keeper identifier of the bus master transferred or passed as the argument to clear the value of a summation time Tsum to zero. Consequently, context switching to a thread of other bus master is performed. When other bus master is outputting a bus request, the corresponding bus master to which control is transferred, executes the processing from Step (1) with the context switching to the thread of the bus master.

(4) A bus request of highest priority is selected from within bus requests each having the smallest simulation time, stored in the bus request queue.

(5) When the time keeper identifier for the selected bus request coincides with a time keeper identifier given as an argument for this bus request, the bus arbiter proceeds to the following Step (6). If not so, that is, when the bus request of other bus master is selected, the thread of the bus master is held in a waiting state. This waiting state is released and the waiting thread is activated to proceed the next states at Step (6). After the waiting state is released at Step (6), the bus arbiter proceeds to Step (4).

(6) The bus is occupied until access to the bus slave by the selected bus request is completed and the bus is released. When the bus is released, a waiting state of other bus master is released by a notify method.

Bus requests of all bus masters executed at a given time are stored in the corresponding queue at the execution of the flush_time method at Step (3) under the above procedures. At Step (4), a bus request of highest priority is selected.

Figure 5:
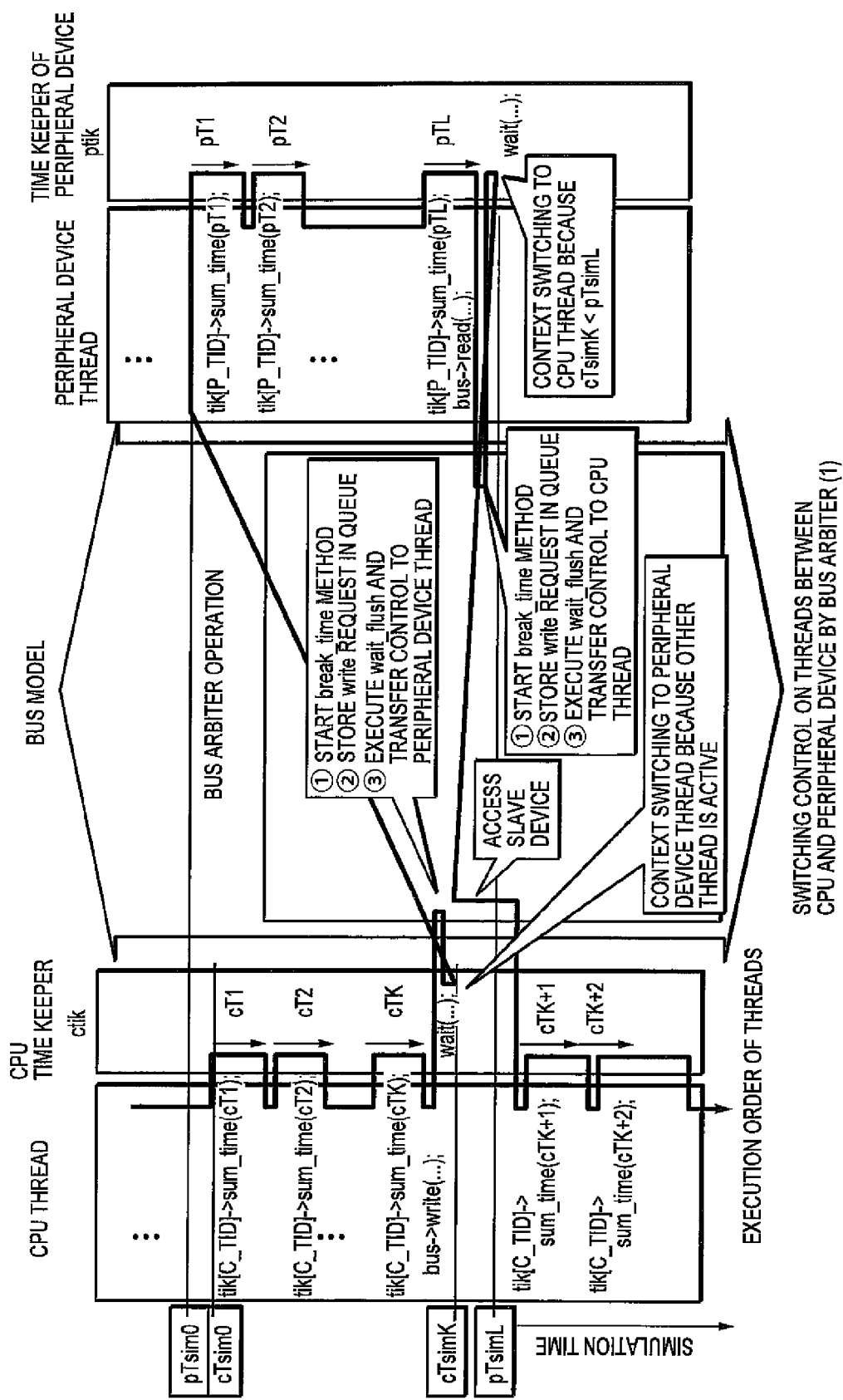
FIG. 5 is a diagram for describing switching control (1) on threads between the CPU and its corresponding peripheral device by a bus arbiter.
Figure 6:
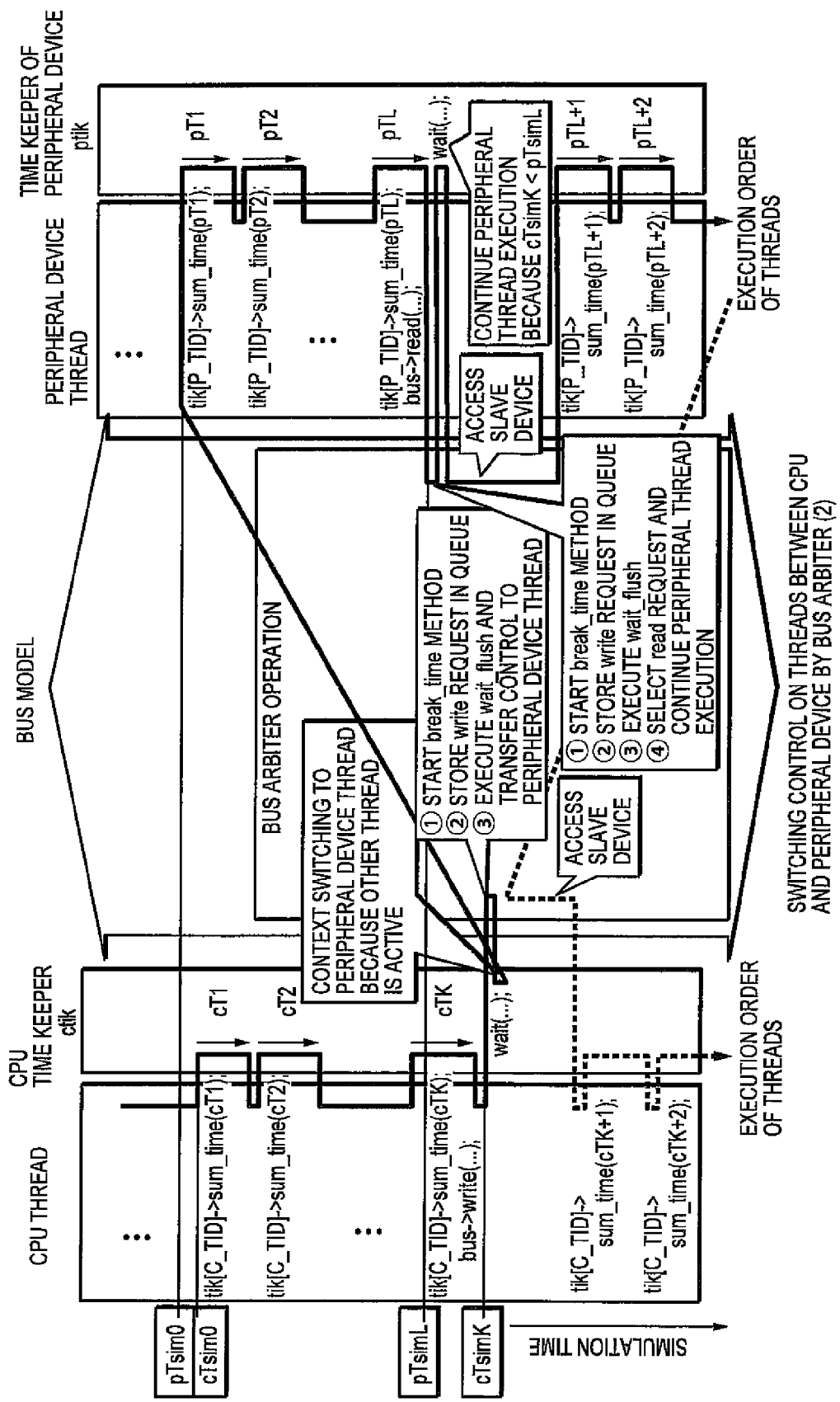
FIG. 6 is a diagram for describing switching control (2) on threads between the CPU and its corresponding peripheral device by the bus arbiter.

FIGS. 5 and 6 are respectively diagrams for describing respective switching control (1 and 2) on threads between the CPU and its corresponding peripheral device by the bus arbiter.

FIG. 5 shows a case in which two bus masters of a CPU thread and a peripheral device thread are connected to a bus, and the CPU thread outputs a bus request for performing write access of data by a bus->write method and the peripheral device thread outputs a bus request for performing read access of data by a bus->read method.

Assume now that a main thread of the CPU invokes the bus->write method when the simulation time is advanced in the order of elapsed times cT1, cT2, . . . , cTK, and the peripheral device thread invokes the bus->read method when the simulation time is advanced in the order of elapsed times pT1, pT2, . . . , pTL. Also assume that the simulation time of the corresponding time keeper ctik subsequent to the tik[C_TID]->sum_time(cTK) method invocation is cTsimK, the simulation time subsequent to the tik[P_TID]->sum_time (pTL) method invocation is pTsimL, and the simulation time prior to the tik[P_TID]->sum_time(pT1) method invocation is pTsim0.

When the CPU thread has invoked the bus->write method, the bus arbiter is started up. The bus arbiter stores a bus request in the queue at Step (2) and performs the invocation of the tik[C_TID]->flush_time method at Step (3). Consequently, a wait function invocation of the SystemC simulator is performed. When the cTsimK is larger than the pTsim0, the kernel of the SystemC simulator performs context switching to the thread of the peripheral device to transfer control to the thread of the peripheral device.

When the peripheral device thread to which the control is transferred or passed by the context switching has invoked the bus->read method, the bus arbiter is started up. The bus arbiter stores a bus request in the queue at Step (2) and performs the invocation of a tik[PJID]->flush_time( ) method. Thus, the wait function invocation of the SystemC simulator is performed and context switching between threads is performed as needed.

When the cTsimK is smaller than the pTsimL as shown in FIG. 5, context switching to the CPU thread occurs again due to the tik[P_TID]->flush_time method invocation by the bus arbiter. A solid arrow indicated by a kinked line shown in the same figure indicates the flow of control between such threads. At Step (4), the bus arbiter selects a bus request of highest priority from the queue. In this case, the invocation of the bus->write method requested by the corresponding thread of the CPU is selected. After the execution of bus access by the CPU, processing of tik[C_TID]->sum_time(cTK+1), tik [C_TID]->sum_time(cTK+2), . . . method invocations of subsequent CPU threads are performed.

FIG. 6 shows a case in which when thread executive control similar to FIG. 5 is performed, the cTsimK is greater than the pTsimL. In the case of the bus->read method invocation subsequent to the invocation of the tik[P_TID]->sum_time(pTL) method at this time, context switching by the invocation of the tik[P_TID]->flush_time method at the bus arbiter does not occur.

At Step (4), the bus arbiter selects a bus request of highest priority from the queue. In this case, the invocation of a bus->read method requested by the corresponding thread of the peripheral device is selected. After the execution of bus access by the thread of the peripheral device, processing of tik[P_TID]->sum_time(pTL+1),tik[P_TID]->sum_time (pTL+2), . . . method invocations of subsequent peripheral-device threads are performed. A solid arrow indicated by a kinked line shown in FIG. 6 indicates the flow of control between such threads.

When each peripheral device advances processing and has performed the tik[P_TID]->flush_time method invocation, context switching is performed on the CPU thread again as indicated by a broken-line arrow shown by a kinked line in FIG. 6, so that access by the bus->write method is processed.

When the cTsimK and pTsimL are equal to each other, whether the context switching to the CPU thread occurs by the invocation of the tik[P_TID]->flush_time( ) method by the bus arbiter, depends upon the used simulator.

When the context switching to the CPU thread is found not to have occurred, the bus arbiter selects a bus request of higher priority from within two bus requests (i.e., bus request by the bus->write method from the thread of the CPU and bus request by the bus->read method from the thread of the peripheral device) stored in the queue and issued at the same simulation time at Step (4).

When the priority of the bus request by the CPU thread is found to be higher than that of the bus request by the thread of the peripheral device at Step (4), the thread of the peripheral device recognizes that the bus request selected at Step (5) does not correspond to the bus request issued from its own time keeper, and is held in a waiting state until the bus request of the CPU thread is completed. Consequently, context switching to the CPU thread is performed. In this case, the flow of control between the threads is similar to FIG. 5.

When the bus request of the CPU thread is found to be lower in priority than the bus request of the thread of the peripheral device at Step (4) in reverse, the thread of the peripheral device recognizes that the bus request selected at Step (5) corresponds to the bus request issued from its own time keeper. After the bus access by the thread of the peripheral device is performed, processing of each subsequent peripheral device is performed. In this case, the flow of control between threads is identical to FIG. 6.

(E1) Interrupt Control (Part 1)

There is a case in which it is desired to notify the occurrence of an asynchronous event sent from outside to the corresponding thread after its start-up. This is equivalent to, for example, such a case that after the CPU has started the peripheral device, it is desired for the peripheral device to allow the CPU to produce or generate an interrupt in accordance with an interrupt signal and notify the state of the peripheral device to the CPU.

The interrupt signal is normally notified to an interrupt controller corresponding to a kind of peripheral device. The interrupt controller makes a decision as to an interrupt permission and an interrupt priority decision when the interrupt signal is notified. When the generated interrupt is permitted and the priority of the interrupt is highest, the interrupt controller notifies an interrupt to the CPU and starts up an interrupt handler provided in the CPU.

The interrupt handler is one of control software of the CPU, which is executed when an interrupt request is issued from the peripheral device. It is modeled as the thread of the CPU as mentioned below:

```
class cpu:public sc_module
{
public:
    sc_port<tikIF>ctik; /* port to CPU Time Keeper */
    SC_CTOR (CPU) {
        SC_THREAD(main); /* start main thread */
        SC_THREAD(inthdr); /* start interrupt handler */
    }
    void main(void);
    void inthdr(void);
}
```

A procedure of allowing the peripheral device to start the interrupt handler of the CPU by an interrupt will be described below.

FIGS. 7 through 13 are respectively diagrams for describing interrupt control (1 through 7) from the peripheral device to the CPU. The vertical axis indicates interrupt timing set as the simulation time.

Figure 7:
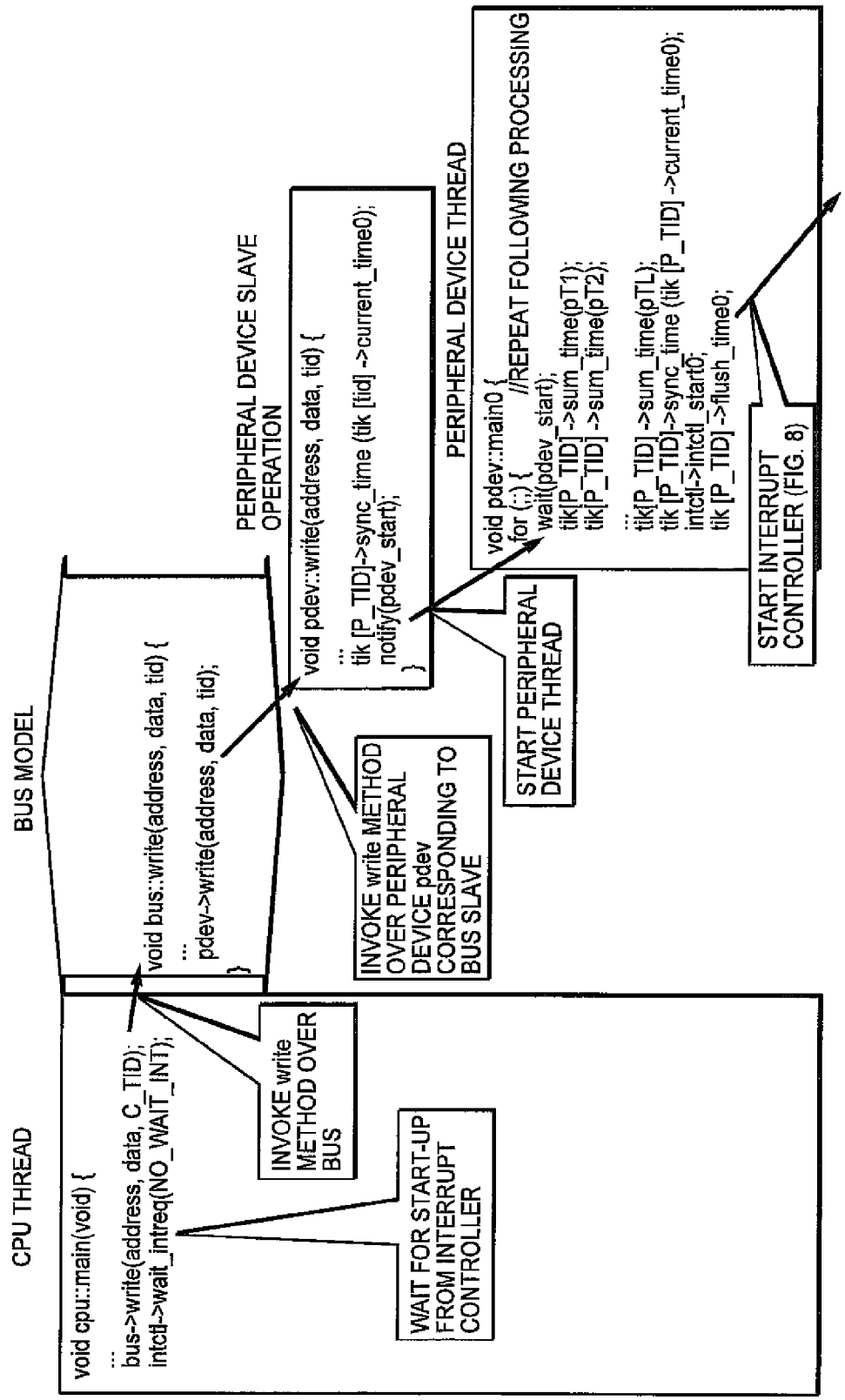
FIG. 7 is a diagram for describing interrupt control (1) from the peripheral device to the CPU.

FIG. 7 shows the flow of control until the main thread of the CPU starts the peripheral device and is brought to an interrupt wait. Its procedure will be described below.

(1) Start-Up of Peripheral Device by Main Thread of CPU

A descriptive example of the main thread of the CPU is shown below.

```
void cpu::main(void) {
    bus->write (address,data,C_TID); /* start peripheral device thread */
    intctl->no_wait_intreq( ); /* wait for interrupt request from peripheral device */
    tik[C_TID]->sum_time(cT1);
    tik[C_TID]->sum_time(cT2);
    ...
    tik[C_TID]->sum_time(cTK);
}
```

The main thread of the CPU starts the thread of the peripheral device through via-bus peripheral device access by bus->write method invocating means or the like. Thereafter, the main thread of the CPU performs an invocation of an intctl->no_wait_intrerq method on the interrupt controller intctl to wait for an interrupt request.

The no_wait_intreq method is of a method invoked immediately after the start-up of the peripheral device where a CPU operation and a peripheral device operation are activated in parallel without waiting for an interrupt request from the peripheral device.

The no_wait_intreq method sets NO_WAIT_INT meaning that the CPU is operated in parallel with a peripheral device driver without waiting for the occurrence of an interrupt, to a cpu_wait_int variable and thereafter waits for an interrupt notification from the corresponding peripheral device after execution of a wait(intreq_start) invocation, as represented by the following descriptive example:

```
void intctl::no_wait_intreq(void){
    cup_wait_int=NO_WAIT_INT;
    wait(intreq_start) ;
}
On the other hand, when the CPU waits for the
occurrence of the interrupt, it performs an
intc1->wait_intreq method invocation on the interrupt
controller intctl and sets the value of WAIT_INT to the
cpu_wait_int variable. A descriptive example of the
wait_intreq method is shown below:
void intctl::wait_intreq(void){
    cpu_wait_int=WAIT_INT;
    wait(intreq_start);
}
```

The definition of data type wait_int_t of the value set to the cpu_wait_int is given as shown below, for example:

```
typedef enum {NO_WAIT_INT=0 /* no wait for interrupt request */
        ,WAIT_INT=1 /* wait for interrupt request */
}wait_int_t;
```

The cpu_wait_int variable is referred to by an interrupt request processing thread int_request.

(2) Notification of Interrupt Request from Peripheral Device Thread

The peripheral device pdev is started by the corresponding write method from the CPU and thereafter performs processing for advancing the simulation time as needed. When it is necessary to notify the interrupt to the CPU, the peripheral device performs an interrupt notification to the interrupt controller intctl.

A descriptive example of a slave operation of the peripheral device pdev is shown:

```
void pdev::write(long address,long data,tid_t tid){
    tik[tid]->sum_time(Tacc);
    to perform writing of data into register designated by address;
    if(where peripheral device is started by the above writing){
        tik[P_TID]->sync_time(tik[tid]->current_time( ));
        notify(pdev_start);
    }
}
```

A write method at the started peripheral device pdev sets the simulation time of the peripheral device to the simulation time of the CPU by a tik[P_TID]->sync_time(tik[tid]->current_time) method invocation and thereafter starts a main thread of a peripheral device shown below by a notify(pdev_start) method invocation.

```
void pdev::main( ){
    for(;;){   /* repeat the following processing */
        wait(pdev_start); /* wait until notify(pdev_start)
is executed */
        tik[PJID]->sum_time(pT1); /* add elapsed time pT1 to
simulation time of ptik */
        tik[PJID]->sum_time(pT2); /* add elapsed time pT2 to
simulation time of ptik */
        ...
        tik[PJID]->sum_time(pTL); /* add elapsed time pTL to
simulation time of ptik */
        /* notify interrupt request to CPU by the following
procedure */
        tik[I_TID]->sync_time(tik[P_TID]->current_time( )) ;
        intctl->intctl_start( ); /* notify interrupt request
to interrupt controller */
        tik[P_TID]->flush_time( );
        /* transfer control to interrupt controller */
    }
}
```

The main thread of the started-up peripheral device advances the simulation time of the peripheral device by the sum_time method invocation as needed. When it is necessary to notify an interrupt to the CPU, the main thread invokes the intctl->intctl_start method over the interrupt controller intctl and notifies an interrupt request to the interrupt controller.

Figure 8:
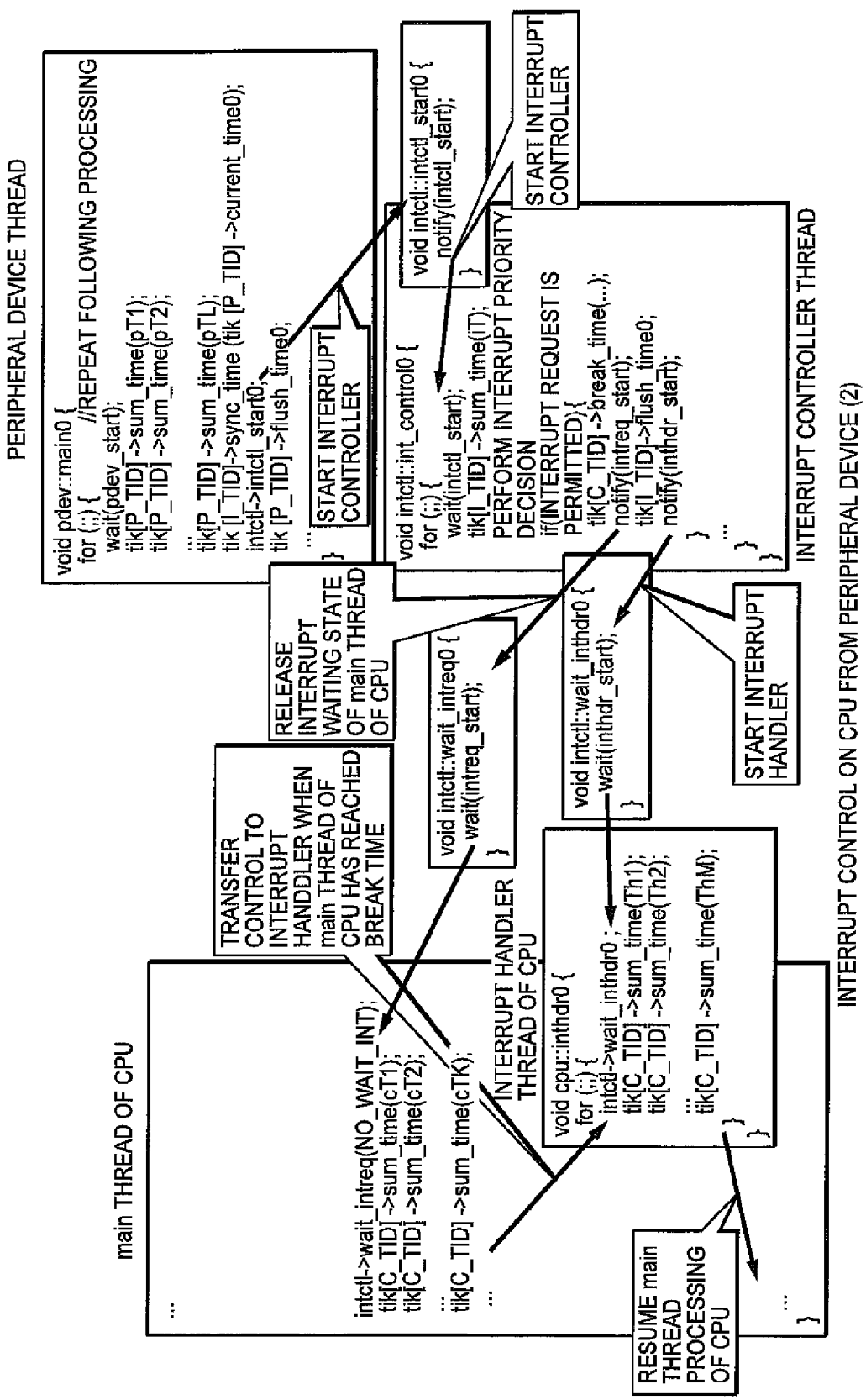
FIG. 8 is a diagram for describing interrupt control (2) from the peripheral device to the CPU.

FIG. 8 shows the flow of control until the main thread of the peripheral device pdev notifies an interrupt to the corresponding main thread of the CPU to start the interrupt handler and transfers control to the main thread of the CPU. Its procedure will be described below.

(3) Interrupt Priority Decision by Interrupt Controller

The intctl_start method at the interrupt controller intctl starts an int_control thread of the interrupt controller by a notify(intctl_start) method invocation as shown in the following descriptive example:

```
void intctl::intctl_start( ){
    notify(intctl_start);
}
void intctl::int_request( )}
    for(;;){
        wait(intctl_start); /* wait for occurrence of interrupt
*/
        tik[I_TID]->sum_time(iT); /* perform priority
decision as to addition of iT elapsed time to simulation
time of itaik and interruption thereof */
        if(interrupt request is allowed) {
            if(cpu_wait_int=NO_WAIT_INT)
                tik[C_TID]->break_time(
                    tik[I_TID]->current_time( ) /* set interrupt
occurrence time to break time of CPU */
                    ,tik[I_TID]->current_sc_time( ) /* set
interrupt occurrence system time */
                    ,&TikIF::flush_time); /* set flush_time to
break method of CPU */
            else
                tik[C_TID]=sync_time(tik[I_TID]->current_time( );
            notify(intreq_start);
            tik[I_TID]->flush_time( );
            notify(inthdr_start);
        }
    }
}
```

Here, I_TID indicates a time keeper identifier of the interrupt controller and is defined as shown below by adding I_TID to the above tid_t:

```
Typedef enum{C_TID=0 /* Time Keeper#1=CPU */
            ,P_TID=1 /* Time Keeper#2=Peripheral */
            ,I_TID=2 /* Time Keeper#3=Interrupt Controller */
}tid_t; /* time keeper id type */
```

As described above, the int_control thread of the interrupt controller intctl waits for an interrupt request event intctl_start from the peripheral device by wait (intctl_start). When the peripheral device has released this interrupt occurrence waiting state by the intctl_start method invocation, the int_control thread performs a priority decision as to an interrupt request from the peripheral device.

If the acceptance of the interrupt request is permitted, then the value of cpu_wait_int is set to NO_WAIT_INT by a no_wait_int method invocation at the main thread of the CPU in the present example. Therefore, the corresponding break_time method invocation is effected on the time keeper ctik of the CPU. Arguments at this time are the current simulation time tik[I_TID]->current_time of the interrupt controller, the current system time tik[I_TID]->current_sc_time and the flush_time method. With this invocation, the interrupt occurrence time is set as the break time of a CPU time keeper, and the flush_time method is set as the break method.

Thereafter, the waiting state of the CPU is released by a notify(inthdr_start) method invocation, and the corresponding flush_time method invocation is performed. Thus, control is transferred or passed to the main thread of the CPU. Afterwards, the interrupt handler is started by a notify(inthdr_start) invocation.

(4) Continuation of Processing Up to Interrupt Start-Up at Main Thread of CPU

The main thread of the CPU releases an interrupt request waiting state from the peripheral device by an intctl->no_wait_intreq( ) method invocation through the notify(intreq_start) method invocation and advances the simulation time by a sum_time method invocation following subsequently. When the simulation time has reached the break time set by the break_time method invocation or more, control is transferred to the interrupt handler started by the notify(inthdr_start) method invocation through the corresponding break method (flush_time method for the CPU time keeper) invocation.

(5) Execution of Interrupt Handler of CPU

A descriptive example of the interrupt handler inthdr of the CPU is shown below.

```
void cpu::inthdr( ){
    for(;;){
        intctl->wait_inthdr( ); /* wait for interrupt
notification by interrupt controller */
        tik[C_TID]->sum_time(hT1);
        tik[C_TID]->sum_time(hT2);
        ...
        tik[C_TID]->sum_time(hTM);
    }
}
```

An interrupt handler thread inthdr performs an invocation of an intctl->wait_inthdr method on the interrupt controller intctl. This wait_inthdr method performs a wait(inthdr_start)

method invocation as shown in the following descriptive example and thereby waits for an interrupt notification from the peripheral device:

```
void intctl::wait_inthdr (void){
    wait(inthdr_start);
}
```

The interrupt waiting state at the interrupt handler intdhr is released when the notify(inthdr_start) method invocation is performed at an interrupt request processing thread int_request at the above interrupt controller intctl.

When the started interrupt handler is executed and its processing is completed, the interrupt handler performs the intctl->wait_inthdr method invocation again and assumes the next interrupt request waiting state. Consequently, control is transferred to the main thread of the CPU again.

(6) Resumption of Main Thread Processing of CPU

The main thread processing subsequent to the interrupt handler processing is resumed.

Figure 9:
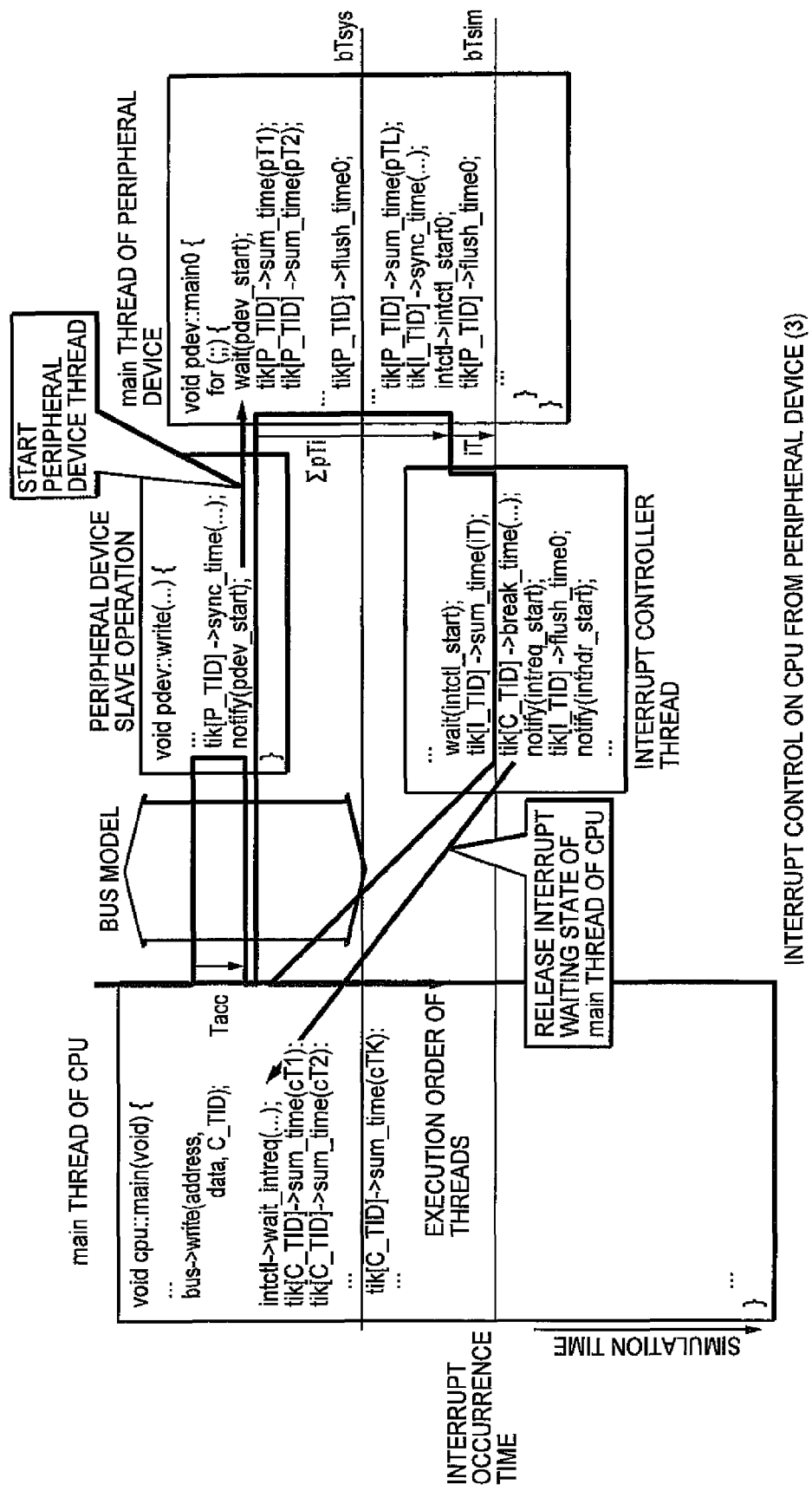
FIG. 9 is a diagram for describing interrupt control (3) from the peripheral device to the CPU.

FIG. 9 shows the manner of simulation time at the time that the break_time method is executed at Step (3).

As shown in FIG. 9, the main thread of the CPU starts the corresponding peripheral device and thereafter assumes an interrupt waiting state until an interrupt request from the peripheral device is issued. The peripheral device sets the simulation time of its time keeper to the time when the peripheral device is started by the CPU, through a sync_time method invocation, and advances the simulation time by a sum_time invocation subsequently.

When the peripheral device obtains access to other peripheral device such as a memory via a bus at this time, the summation time Tsum of its time keeper may be cleared to zero by a flush_time method invocation. With the flush_time method invocation, the system time of the SystemC simulator is updated so as to coincide with the simulation time of this time keeper. The system time of this peripheral device is set as bTsys.

After the peripheral device has performed the flush_time method invocation, it advances the simulation time of its time keeper by the sum_time method invocation and notifies an interrupt request to the corresponding interrupt controller when the simulation time thereof has reached bTsim.

When the interrupt request is notified to the interrupt controller, the system time of the peripheral device being managed by the SystemC simulator remains set to the value bTsys at the time that the flush_time method invocation has been executed. However, the simulation time managed by the time keeper is updated to bTsim by its subsequent sum_time method invocation.

The int_control thread of the interrupt controller is started by an interrupt notification and performs a break time method invocation with the bTsim, bTsys and break method flush_time as arguments.

The interrupt waiting state at the main thread of the CPU is released by the corresponding notify(intreq_start) method invocation immediately after the break_time method invocation. The system time of the SystemC simulator of the main thread of the CPU at this time is set to the system time of the peripheral device having performed the notify method invocation. In this case, the system time is set to the value of the system time bTsys of the peripheral device at which the waiting state has been released.

Thus, the simulation time Tsim of the time keeper of the CPU remains at the time when interrupt waiting is made to the interrupt controller intctl. However, the system time is still the system time bTsys released by the notify(intreq_start) method invocation, thus resulting in the fact both times are different from each other.

As described above, the calculation of summation time by referring to the break system time where the break system time is stored in the break time queue at the break_time method except for the break time and break method and the break time queue is not empty at the sum_time method is done to correct the difference between the simulation time and the break system time.

When the system time of the peripheral device set by the break_time method invocation is set as bTsys, the break time queue is not empty at the sum_time method invocation at the main thread of the CPU. Therefore, the setting of the summation time is conducted as follows:

Since the simulation time Tsim of the CPU time keeper does not reach the break system time bTsys when the time Tsim is smaller than the time bTsys, the value of the summation time Tsum is cleared to zero.

Since the simulation time Tsim of the CPU time keeper reaches the break system time bTsys or more, the value of the summation time Tsum is set to the value of (Tsim−bTsys). Consequently, the simulation time Tsim of the CPU time keeper coincides with the system time managed by the kernel of the SystemC simulator.

Figure 10:
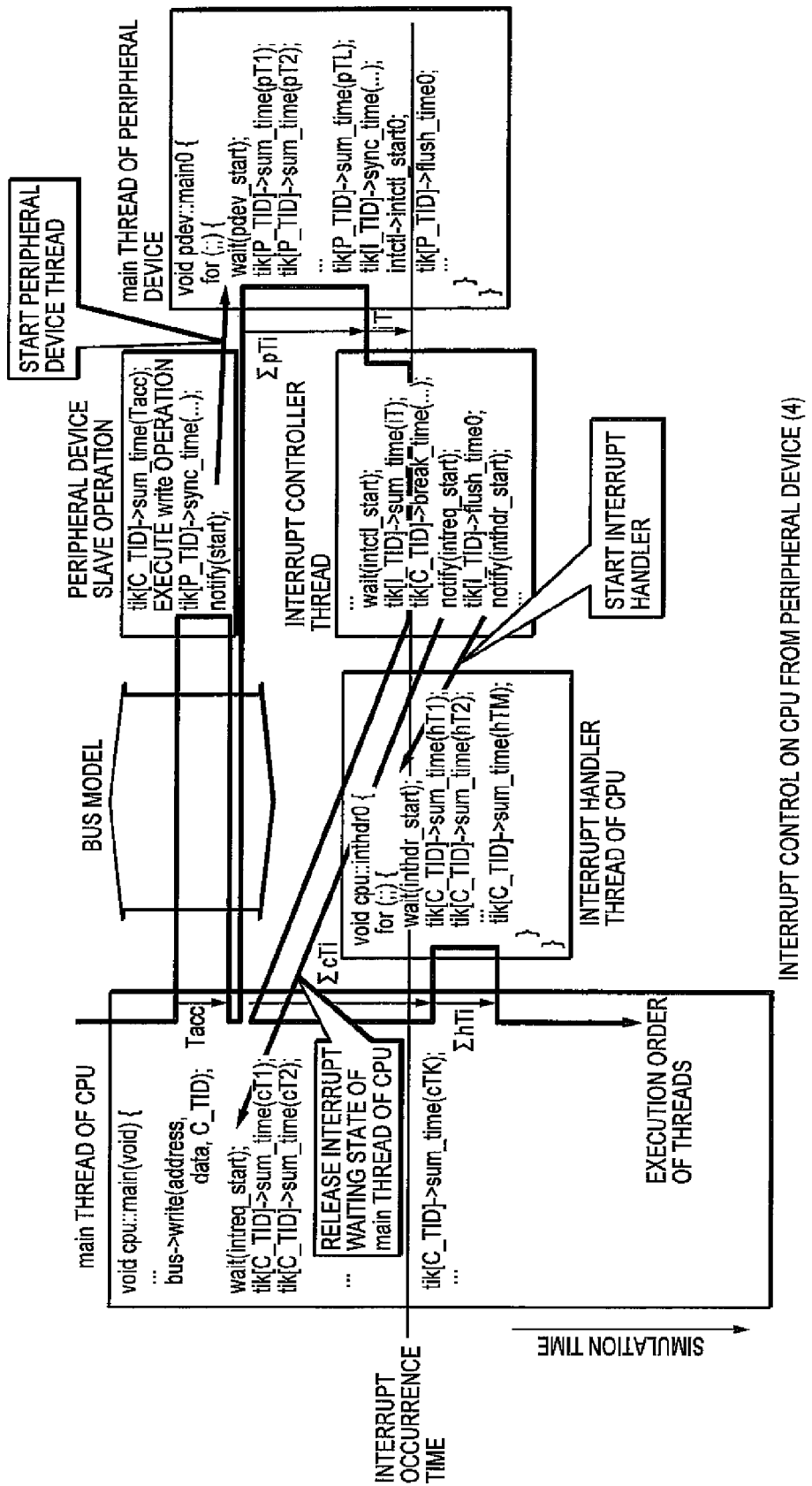
FIG. 10 is a diagram for describing interrupt control (4) from the peripheral device to the CPU.

Assuming that as shown in FIG. 10, elapsed times of the main thread of the CPU subsequent to the start-up of the peripheral device are cT1, cT2, . . . , cTK, elapsed times up to the generation of an interrupt request of the main thread of the peripheral device subsequent to the start-up of the peripheral device are pT1, pT2, . . . , pTL, and an elapsed time taken for an interrupt priority decision at the interrupt controller is iT, respectively, the following relationship is established:

$$(cT1+cT2+\ldots+cTK-1) \leq (pT1+pT2+\ldots+pTL)+iT \leq (cT1+cT2+\ldots+cTK)$$

That is, the above shows where when a tik[C_TID]->sum_time(cTK) method invocation at the main thread of the CPU is performed, the simulation time of the CPU exceeds the break time (interrupt notification time for the CPU) set to its time keeper. The CPU invokes the sum_time method at the main thread and thereafter starts the execution of an interrupt handler thread.

Incidentally, an interrupt request queue management is actually performed in a manner similar to the bus arbiter to accept interrupt requests from a plurality of peripheral devices upon the processing of the interrupt controller at Step (3) referred above. Detailed processing of the interrupt controller will be show below.

(3-1) The interrupt controller stores an interrupt request and simulation time of each peripheral device having requested an interrupt in the corresponding interrupt request queue.

(3-2) A flush_time method is executed on the peripheral device having requested the interrupt. Consequently, control is transferred to other peripheral device having a possibility of generating an interrupt, and the processing from above (3-1) is repeated.

(3-3) Of the interrupt requests smallest in simulation time, which are stored in the interrupt request queue, the interrupt request of highest priority is selected.

(3-4) When the selected interrupt request corresponds to an interrupt request issued from this peripheral device, the above processing proceeds to the following Step (3-5). If not so, that is, when an interrupt request of other peripheral device is selected, the thread of the corresponding peripheral device is brought to a waiting state. This waiting state is released at Step (3-5). After the waiting state has been released, the processing proceeds to Step (3-3).

(3-5) When interrupt handler processing based on the selected interrupt request is started, a waiting state of other interrupt request is released by notify.

In order to set the simulation time to that of the peripheral device with respect to the time keeper ctik of the CPU via the interrupt controller when the interrupt request is made, the peripheral device invokes the corresponding tik[C_TID]->sync_time(tik[P_TID]->current_time( )) method. Thereafter, the peripheral device invokes the corresponding interrupt handler defined as software of the CPU.

(E2) Interrupt Control (Part 2)

Figure 11:
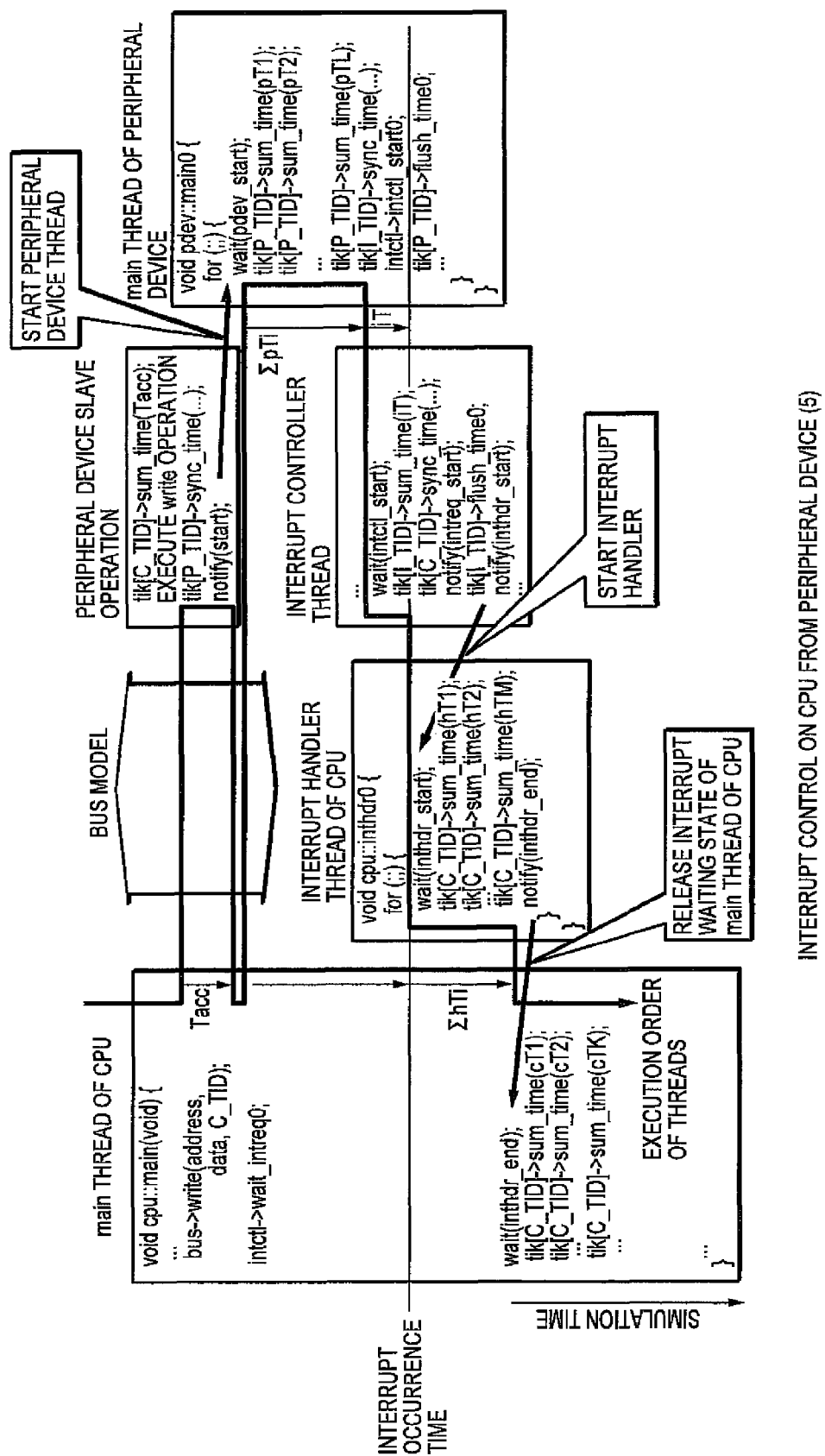
FIG. 11 is a diagram for describing interrupt control (5) from the peripheral device to the CPU.

As a special case of the interrupt control (part 1), there is a case in which after the CPU has started the main thread of the peripheral device, it assumes an interrupt handler wait immediately. In such a case, bus access for starting up the thread of the peripheral device at the main thread of the CPU is performed as shown in FIG. 11. Thereafter, the corresponding intctl->wait_intreq method invocation is performed on the interrupt controller intctl, and the value of WAIT_INT is set to a cpu_wait_int variable to wait for the occurrence of an interrupt request. Afterwards, a wait(inthdr_end) function is invoked to wait for the completion of the interrupt handler.

A state waiting for the completion of the interrupt handler by the wait(inthdr_end) function invocation is released by the corresponding notify(inthdr_end) method invocation subsequent to the completion of interrupt accepting processing at the interrupt handler. That is, the main thread of the CPU and its corresponding interrupt handler thread may be changed as shown in the following descriptive example:

```
void CPU: :main (void){
    bus->write(address,data,C_TID); /* start peripheral device thread */
    intctl->wait_intreq( ); /* wait for interrupt request */
    wait(inthdr_end); /* wait for end of interrupt handler */
    tik[C_TID]->sum_time(cT1);
    tik[C_TID]->sum_time(cT2);
    ...
    tik[C_TID]->sum_time(cTK);
}
void cpu::inthdr( ){
    for(;;){
        wait(inthdr_start);
        tik[C_TID]->sum_time(hT1);
        tik[C_TID]->sum_time(hT2);
        ...
        tik[C_TID]->sum_time(hTM);
        notify(inthdr_end); /* notify completion of interrupt handler to main thread */
    }
}
```

(E3) Interrupt Control (Part 3)

As an extension of the two interrupt controls (parts 1 and 2), there is a case in which after the main thread of the CPU has started the peripheral device, other processing (for example, preparation for starting the corresponding peripheral device next) is executed, and immediately before the peripheral device is next started up, the CPU desires to confirm whether an interrupt notification from the peripheral device exists and the execution of the interrupt handler is completed.

A descriptive example of the main thread of the CPU in such a case is shown below:

```
void CPU::main(void){
    for(i=0 i<10; i++){
        bus->write(address,data,C_TID); /* start peripheral device thread */
        intctl->no_wait_intreq( ); /* wait for interrupt notification by interrupt controller */
        tik[C_TID]->sum_time(cT1);
        tik[C_TID]->sum_time(cT2);
        ...
        tik[C_TID]->sum_time(cTK);
        if(!inthdr_end_flag) /* when interrupt handler processing is already completed */
            wait(inthdr_end); /* wait for end of interrupt handler */
            inthdr_end_flag=false;
    }
}
```

The above example shows where the main thread of the CPU starts the corresponding peripheral device thread by a bus->write method and thereafter performs processing for advancing the simulation time in the order of elapsed times cT1, cT2, . . . , cTK, after which it waits for completion of execution of the interrupt handler by the wait(inthdr_end) function invocation. In this case, a descriptive example of the interrupt handler inthdr is given as shown below:

```
void cpu: : inthdr 0 {
    for(;;){
        wait(inthdr_start);
        tik[C_TID]->sum_time(hT1);
        tik[C_TID]->sum_time(hT2);
        ...
        tik[C_TID]->sum_time(hTM);
        inthdr_end_flag=true;
        notify(inthdr_end); /* notify completion of interrupt handler to main thread */
    }
}
```

In the main thread, waiting for an interrupt request from the interrupt controller by the corresponding intctl->no_wait_intreq method invocation after the peripheral device thread is started by the bus->write method is similar to the interrupt control (part 1).

When the waiting state based on the wait(intreq_start) function invocation is released according to the interrupt request from the peripheral device, the main thread of the CPU performs the processing of advancing the simulation time in the order of the elapsed times cT1, cT2, . . . , cTK and thereafter waits for the completion of execution of the interrupt handler by the wait(inthdr_end) function invocation.

The main thread of the CPU performs the processing of advancing the simulation time according to the elapsed time cTK by the corresponding tik[C_TID]->sum_time(cTK) method invocation and thereafter tests a variable inthdr_end_flag to examine whether the interrupt handler processing is completed.

As shown in the descriptive example of the interrupt handler, the variable inthdr_end_flag is set to true upon completion of the interrupt handler. If the variable is false, it then indicates that the processing of the interrupt handler is not yet completed. The wait(inthdr_end) invocation is performed to wait for the completion of the interrupt handler. If the variable is true, it then indicates that the processing of the interrupt handler has already been completed. The wait(inthdr_end) is skipped to proceed to the next processing.

(E4) Interrupt Control (Part 4)

In the case of any of the interrupt controls (parts 1 through 3), the interrupt controller and the interrupt handler are implemented as independent threads. Therefore, context switching between the threads takes place each time an interrupt occurs, so that a simulation speed is reduced.

Therefore, there is known a method for implementing the interrupt controller and the interrupt handler as methods without implementing them as the threads.

In the interrupt controller, the elapsed time iT required to determine the interrupt request from the peripheral device is a small value equivalent to a few clock cycles or so. Thus, it is also possible to invoke the interrupt controller from the thread of the peripheral device as a method approximately without implementing the interrupt controller as the independent thread and incorporate the elapsed time iT necessary for the determination of the interrupt request as the elapsed time of the CPU inside the interrupt handler thereby to make them approximate.

The interrupt handler inthdr can be invoked from the sum_time method of the CPU time keeper by use of the function of the break_time method. That is, the break time of the CPU time keeper is set to its corresponding interrupt acceptance or reception time upon the invocation of the break_time method at the interrupt controller, and the corresponding method is set to the interrupt handler inthdr.

Using the function of detecting that the simulation time of the CPU time keeper has reached the break time (interrupt acceptance time) or more, the interrupt handler inthdr can be invoked from the corresponding sum_time method by the sum_time method invocation at the main thread of the CPU. In this case, the interrupt handler inthdr and the interrupt controller int_request are defined as methods as in the following descriptive example without being defined as the threads:

```
void cpu::inthdr( ){
    tik[C_TID]->sum_time(iT);/* add elapsed time iT to
simulation time of CPU time keeper */
    tik[C_TID]->sum_time(hT1);
    tik[C_TID]->sum_time(hT2);
    ...
    tik[C_TID]->sum_time(hTM);
}
void intctl::int_request(tid_t tid){
    to perform interrupt priority decision
    if(interrupt request is permitted){
        if(cpu_wait_int==NO_WAIT_INT)
            tik[C_TID]->break_time(
                tik[tid]->current_time( )/* register
interrupt occurrence time as break time of CPU */
                ,tik[tid]->current_sc_time( )
                ,&TikIF::inthdr);/* register interrupt
handler as break method */
        else
            tik[C_TID]=sync_time(tik[I_TID]-
>current_time( ));/* set interrupt occurrence time to time
of CPU */
        notify(intreq_start);/* release interrupt waiting
state of CPU */
        tik[tid]->flush_time( );/* transfer control to main
thread of CPU */
    }
}
```

Here, &TikIF::inthdr indicates an address for an invocation method of the interrupt handler. For example, this method is defined as a method in a time keeper as follows:

```
void TikIF::inthdr( ){
    cpu->inthdr( );
}
```

That is, when the inthdr method defined in the time keeper is invoked as the break method, the corresponding interrupt handler inthdr defined in the CPU is invoked. The main thread of each peripheral device invokes the above interrupt controller method with a time keeper identifier of the peripheral device as an argument as in the following description example:

```
void pdev::main( ){
    for(;;){ /* repeat following processing */
        wait(pdev_start); /* wait until notify(pdev_start)
is executed */
        tik[P_TID]->sum_time(pT1); /* add elapsed time pT1 to
simulation time of ptik */
        tik[P_TID]->sum_time(pT2); /* add elapsed time pT2 to
simulation time of ptik */
        ...
        tik[P_TID]->sum_time(pTL); /* add elapsed time pTL to
simulation time of ptik */
        intctl->int_request(P_TID); /* invoke interrupt
controller method */
    }
}
```

Figure 12:
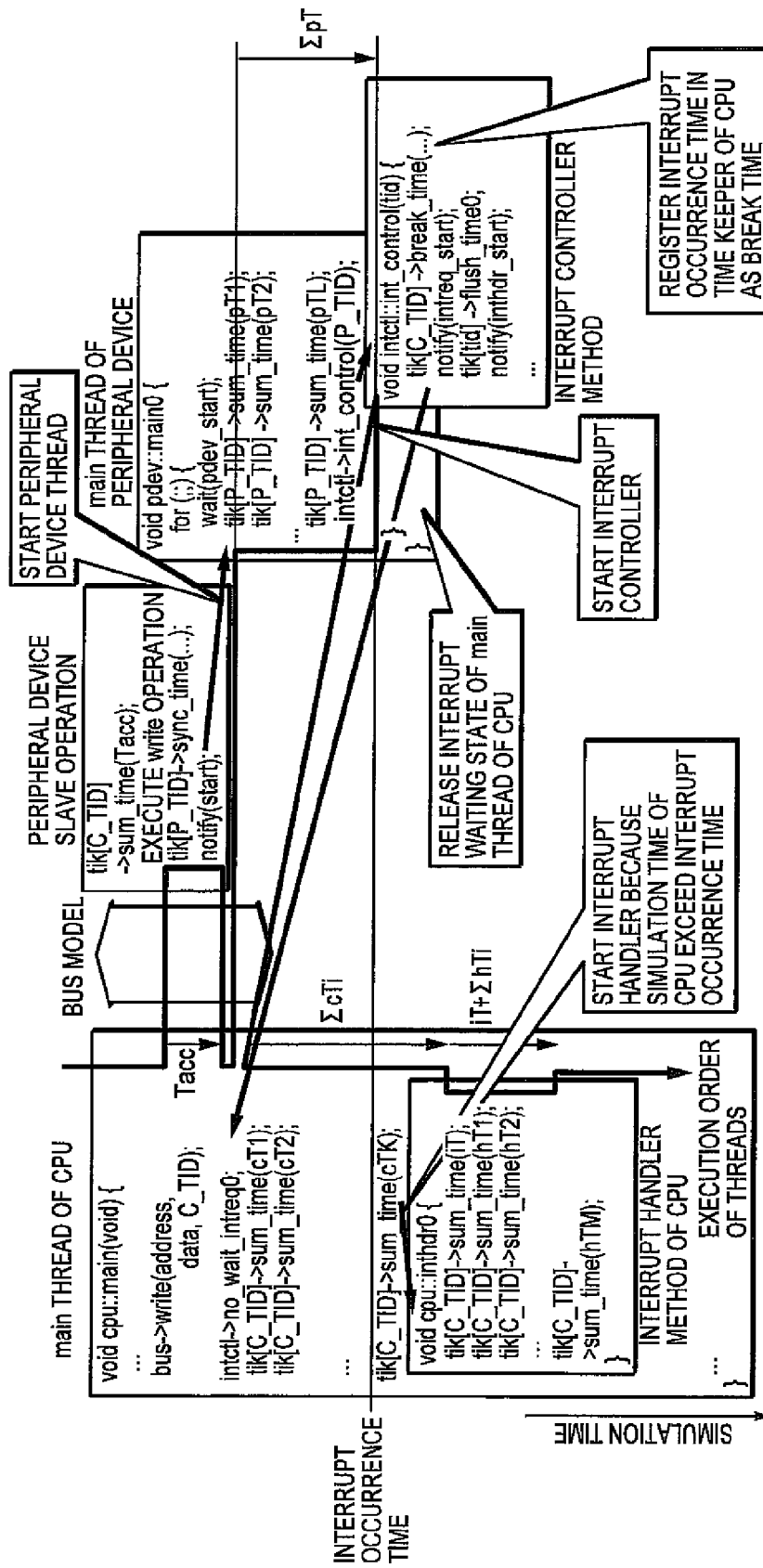
FIG. 12 is a diagram for describing interrupt control (6) from the peripheral device to the CPU.
Figure 13:
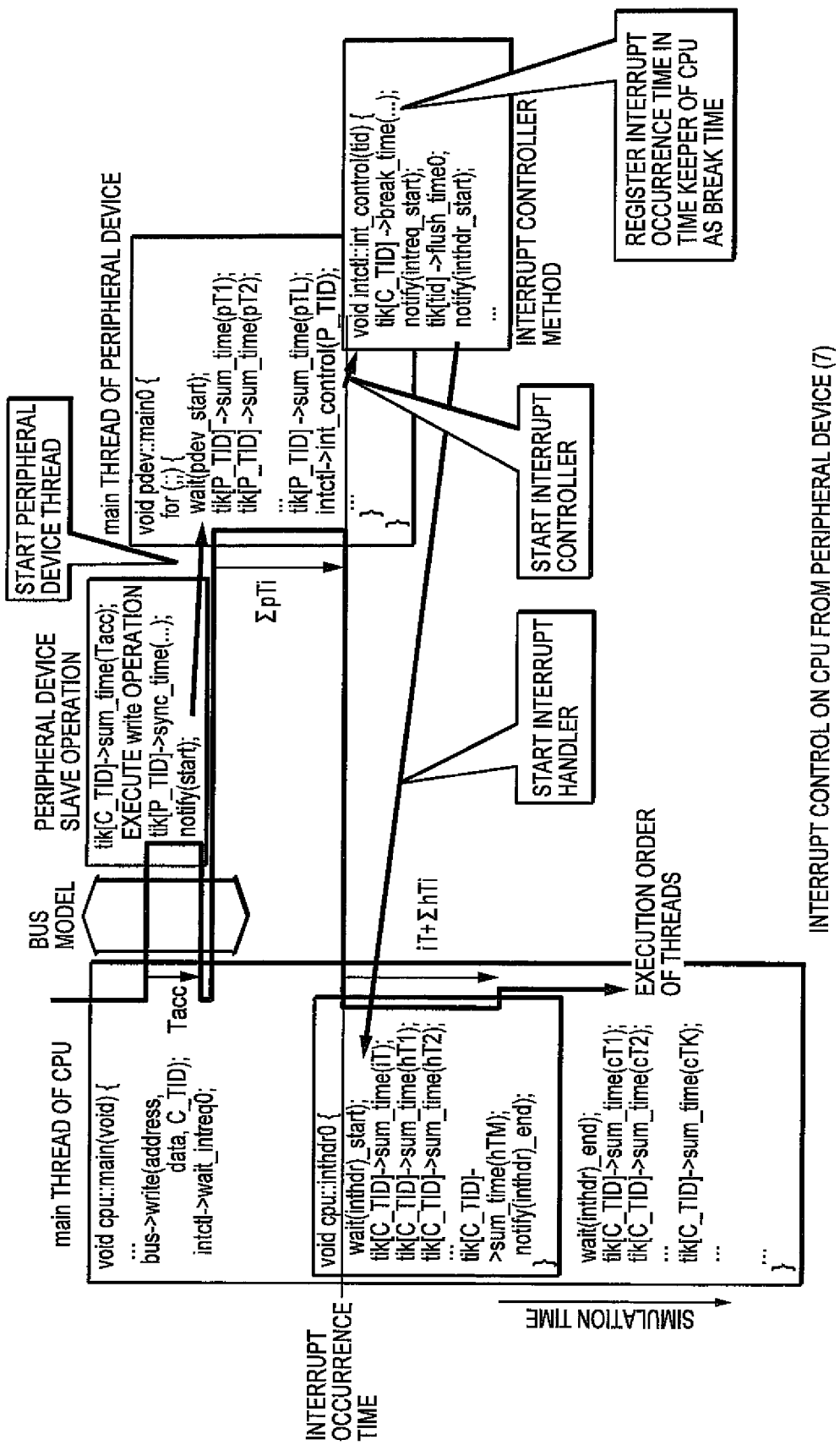
FIG. 13 is a diagram for describing interrupt control (7) from the peripheral device to the CPU.

The descriptive example of the main thread of the CPU is similar to the interrupt control (part 1). FIGS. 12 and 13 respectively show interrupt timings corresponding to the interrupt control (part 1) and the interrupt control (part 2) where such control is performed.

Since the simulator of the first embodiment has the sixth method functions such as the current_time method, etc. as described above, the number of times that the wait function of the SystemC simulator is invoked can be reduced. Thus, the simulator has advantages that the overhead of context switching control with the wait function invocation can be reduced and the simulation time can be shortened.

Second Preferred Embodiment

The second embodiment is equivalent to one in which the function of the sum_time method in each time keeper employed in the first embodiment is extended as follows:

When a break request queue is not empty and updated Tsim has reached greater than a break time stored at the head of the break request queue, a sum_time method of the second embodiment invokes break methods each corresponding to a break time bTsim lying below Tsim in order from the head of the queue and thereafter deletes these from the queue. Thereafter, a summation time Tsum is added to its corresponding simulation time Tsim to advance the simulation time Tsim, and each elapsed time tim is added to the summation time Tsum to update or renew the summation time Tsum.

When the summation time Tsum exceeds a threshold value Tthr, a flush_time method invocation is performed. Here, the threshold value Tthr designates the maximum value of the summation time Tsum. When the summation time Tsum exceeds the threshold value Tthr, the flush_time method invocation is conducted. Consequently, a wait function of a SystemC simulator is invoked and context switching between threads is performed.

That is, if the threshold value Tthr is set to a suitable value, then context switching between the threads is performed at suitable simulation time intervals, and a high-speed simulation can be realized. When the value of the threshold value Tthr is set to 0 as a special case, the flush_time method is invoked each time a sum_time method invocation is performed, and the wait function of the SystemC simulator is invoked. Therefore, this becomes substantially equivalent to the invocation of the wait function of the SystemC simulator as an alternative to the execution of the sum_time method invocation. Thus, each time the invocation of the sum_time method is performed, context switching between the threads is done.

Thus, the simulator of the second embodiment has an advantage that a high-speed simulation is enabled as compared with the simulator of the first embodiment by the extension of the function of the sum_time method.

Third Preferred Embodiment

The third embodiment is provided in which a time keeper integrated module tiks corresponding to a module in which time keepers are integrated, is added to the simulator of the first or second embodiment.

If all required time keepers are connected to the time keeper integrated module tiks and the time keeper integrated module tiks is connected to respective devices, then the respective devices are capable of referring to these time keepers via the time keeper integrated module tiks.

Thus, method invocations of necessary time keepers can be performed by providing the time keeper integrated module tiks and connecting the time keeper integrated module tiks to the respective devices. With the connection of the time keeper integrated module tiks, the connection of the time keepers is simplified in a manner just like similar to connections to clocks at a clock synchronous type simulation model.

The time keeper integrated module tiks has at least methods shown below.

break_time(tid_t d_tid,uint64 bTsim,uint64 bTsys,void (TikIF:*method)( )) method (seventh function): A break_time(bTsim, bTsys, method) method invocation is performed on a time keeper designated by a time keeper identifier d_tid.

flush_time(tid_t tid) method (eighth function): A flush_time(time) method invocation is performed on a time keeper designated by a time keeper identifier tid.

sum_time(tid_t tid,long time) method (ninth function): A sum_time(time) method invocation is performed on a time keeper designated by the time keeper identifier tid.

current_time(tid_t tid) method (tenth function): A current_time method invocation is performed on a time keeper designated by the time keeper identifier tid and the result thereof is returned as a returned value.

sync_time(tid_t tid,uint64 sTsim) method (eleventh function): A sync_time(sTsim) method invocation is performed on a time keeper designated by the time keeper identifier tid.

Here, tid indicates a time keeper identifier indicating which method invocation to each time keeper should be performed. A descriptive example of these methods is shown below.

```
void tiks::break_time(tid_td_tid,uint64 bTsim,uint64
bTsys,void(TikIF::*method)( )){
    tik[(d_tid)->break_time(bTsim,bTsys,method);
}
void tiks::flush_time(tid_t tid){
    tik[tid]->flush_time( );
}
void tiks::sum_time(tid_t tid,long time){
    tik[tid]->sum_time(time);
}
uint64 tiks::current_time(tid_t tid){
    return tik[tid]->current_time( );
}
void tiks::sync_time(tid_t tid,uint64 sTim){
    tik[tid]->sync_time(sTim);
}
```

Therefore, a time keeper integrated module tiks class is defined as shown below, for example:

```
class tiks
:public sc_module
,public tiksIF
{
    public:
        sc_port<tikIF, 0>tik: /*ports to CPU time keepers */
        void break_time(tid_t d_tid,uint64 bTsim,uint64
bTsys,void(TikIF::*method)( ));
        void flush_time(tid_t tid);
        void sum_time(tid_t tid,long time);
        uint64 current_time(tid_t tid);
        void sync_time(tid_t tid,uint64 sTsim);
}
```

Using this function, time keeper connections to the time keeper integrated module tiks are conducted as follows:
cpu=new cpu("cpu");
pdev=new pdev("pdev");
tdev=new tdev("tdev");
tiks=new tiks("tiks")
ctik=new tik("ctik");
ptik=new tik("ptik");
ttik=new tik("ttik");
cpu->tiks(*tiks);
pdev->tiks(*tiks);
tdev->tiks(*tiks);
tiks->ctik(*ctik);
tiks->ptik(*ptik);
tiks->ttik(*ttik);

Thus, the time keeper integrated module tiks may simply be connected to their corresponding ports of the respective threads and hence the time keeper connections are simplified. A descriptive example of a method invocation of each time keeper from each device via the time keeper integrated module tiks is shown below.

```
void CPU::main(void){
    tiks->sum_time(C_TID, cT1);
    tiks->sum_time(C_TID, cT2);
    tiks->sum_time(C_TID, cTK);
}
void pdev::write (long address,long data,tid_t tid){
    tiks->sum_time(tid, Tacc);
    write data into register designated by address;
    if(peripheral device is started by the above writing){
        tiks->sync_time(P_TID,tiks->current_time(tid));
        notify(pdev_start);
    }
}
void pdev::main( ) {
    for(;;){ /* repeat following processing */
        wait(pdev_start); /* wait until notify(pdev_start)
is executed */
```

-continued

```
        tiks->sum_time(P_TID, pT1); /* add elapsed time
    pT1 to simulation time of ptik */
        tiks->sum_time(P_TID, pT2); /* add elapsed time
    pT2 to simulation time of ptik */
        tiks->sum_time(P_TID, pTL); /* add elapsed time
    pTL to simulation time of ptik */
        }
    }
```

As described above, the simulator of the third embodiment has an advantage that the connections of the time keepers can be simplified as compared with the simulators of the first and second embodiments owing to the addition of the time keeper integrated module tiks.

Fourth Preferred Embodiment

The fourth embodiment is provided which makes use of methods in each of which a time keeper detects that other device is in operation and a flush_time method invocation is performed only when other device is in operation, as an alternative to the execution of the invocation of the flush_time method in the third embodiment.

Therefore, the respective time keepers are respectively provided with variables status each indicative of at least a device's state, and such methods as shown below are added:

set_sleep method (twelfth function): function that sets variable status to a sleep state SLEEP
set_active method (thirteenth function): function that sets variable status to an operating state ACTIVE
get_status method (fourteenth function): function that returns variable status as returned value When each device is started, a tik->set_active method invocation is performed on its time keeper tik to set the device to an operating state. When the device operation is ended and a start-up wait is reached, a tik->set_sleep method invocation is performed on the time keeper tik to set each device to a sleep state. When it is desired to examine the state of each device at an arbitrary time, a tik->get_status method invocation is performed on the time keeper tik thereby to obtain a device state.

A descriptive example of a thread start-up at the above peripheral device is shown below:

```
void pdev::write(long address,long data,tid_t tid){
    tik[tid]->sum_time(Tacc);
    write data into register designated by address;
    if(peripheral device is started by the above writing){
        tik[P_TID]->sync_time(tik[tid]->current_time( ));
        tik[P_TID]->set_active( ); /* set device to
    operating state */
        notify(pdev_start);
    }
}
void pdev::main( ){
    for(;;){ /* repeat following processing */
        wait(pdev_start); /* wait until notify(pdev_start)
    is executed */
        tik[P_TID]->sum_time(pT1); /* add elapsed time pT1
    to simulation time of ptik */
        tik[P_TID]->sum_time(pT2); /* add elapsed time pT2
    to simulation time of ptik */
        tik[P_TID]->sum_time(pTL); /* add elapsed time pTL
    to simulation time of ptik */
        /* notify interrupt request to CPU by following
    procedure */
        tik[I_TID]->sync_time(tik[PJID]->current_time( ));
        notify(intctl_start); /* notify interrupt request
    to interrupt controller */
        tik[P_TID]->flush_time( ); /* transfer control to
    interrupt controller */
        tik[P_TID]->set_sleep( ); /* set device to sleep
    state */
    }
}
```

That is, the corresponding device is set to an operating state by a tik[P_TID]->set_active method invocation before the start-up of a peripheral device thread. Before processing at the peripheral device thread is terminated and the next start-up is placed in a waiting state, the device is set to a sleep state by a tik[P_TID]->set_sleep method invocation.

In addition to the above method, at least methods shown below are prepared for the time keeper integrated module tiks.

switch_threads(tid_t tid) method: perform invocation of flush_time(tid) method on time keeper integrated module tiks where devices other than time keeper designated by time keeper identifier tid are in an operating state.

Whether a device of other time keeper is in an operating state is determined according to get_status(tid)=ACTIVE.

A descriptive example of the switch_threads method is shown below:

```
void tiks::switch_threads(tid_t tid){
    int i;
    for(i=0; i<tik.size( ); i++){
        if(tid=i)
            continue;
        if(tik[i]->get_status=ACTIVE){
            tik[tid]->flush_time( );
            return
        }
    }
}
```

Here, tik.size( ) indicates the function of the SystemC simulator, which determines the number of time keepers connected to their corresponding tik ports of the time keeper integrated module tiks.

As described above, the switch_threads method examines the state of all time keepers connected to the tik ports other than the time keeper identifier tid designated as an argument. If any is ACTIVE, then the flush_time method invocation is performed and thereby control is transferred to the corresponding device being in an active state.

By performing the switch_threads method invocation in place of the execution of the flush_time method invocation at each of the threads such as the CPU, peripheral devices and bus, the number of times that the wait function invocation of the SystemC simulator is performed, is reduced and simulation performance is enhanced.

As described above, the simulator of the fourth embodiment has advantages that since the variables status each indicative of the state of each device, and several method functions for operating the variables status are provided, the number of times that the flush_time method invocation is performed, is reduced and a higher-speed operation is enabled.

Incidentally, the present invention is not limited to the above embodiments. Various modifications can be made thereto. As examples of the modifications, for example, the following are brought about or cited:

(a) Although there is shown the example in which the SystemC simulator is used as its main body based on the C language, a simulator based on a hardware model description language such as SpecC can be used.

(b) The names of functions and arguments are cited by way of example.

(c) The explanations of such operations as shown in FIGS. 2 through 13 are cited by way of example. It is necessary to suitably change the same depending on the functions of hardware and software targeted for simulation.

What is claimed is:

1. A hard/soft cooperative verifying simulator for performing cooperative verification of hardware and software, comprising:
   a plurality of time keepers provided for every plurality of threads, the threads constituting simulation models corresponding to the hardware and software,
   each of the time keepers provided with a first variable for holding a simulation time, a second variable for holding a summation time, a break request queue for storing break requests which each consist of a pair of a break time and a break method corresponding thereto, and a processing function, and
   each of the time keepers controlling a simulation time of each of the threads to which said time keepers respectively correspond, responsive to the simulation time, the summation time, the break time, the break method and the processing function; and
   a simulator body which advances each managed system time by a given required time in response to a request issued from each of the time keepers and controls context switching between the threads being operated in parallel on a computer processor.

2. The hard/soft cooperative verifying simulator according to claim 1, wherein each of the time keepers includes:
   a first function which returns a simulation time of the first variable in response to an invocation;
   a second function which returns a value obtained by subtracting the summation time from the simulation time as the system time in response to an invocation;
   a third function which advances a system time of the simulator body with a summation time of the second variable as the required time in response to an invocation and thereafter clears the second variable to zero;
   a fourth function which registers a given break time, a break system time and a break method in the break request queue;
   a fifth function which, when the break request queue is empty, adds an elapsed time given as an argument to the simulation time to advance the simulation time and adds the elapsed time to the summation time to update the summation time; adds the elapsed time to the simulation time to advance the simulation time when the break request queue exists and the simulation time is less than a break time; and invokes, within the break request queue, a break method in which a break time is greater than or equal to a simulation time, when the break request queue exists and the simulation time is greater than or equal to a break time; and
   a sixth function which, when the time given as an argument is greater than the current simulation time, invokes the fifth function with a difference between the time and a post-renewal simulation time being taken as an argument.

3. The hard/soft cooperative verifying simulator according to claim 2, wherein when the break request queue exists and the updated simulation time reaches a break time stored at the head of the break request queue, the fifth function invokes each break method in order from the head of the break request queue and thereafter adds the summation time to the corresponding simulation time to advance the simulation time and adds the elapsed time to the summation time to update the summation time, and when the updated summation time exceeds a predetermined threshold value, the fifth function invokes the third function.

4. The hard/soft cooperative verifying simulator according to claim 2, which is provided with a time keeper integrated module including:
   a seventh function which invokes the fourth function over a time keeper designated by a time keeper identifier;
   an eighth function which invokes the third function over the time keeper designated by the time keeper identifier;
   a ninth function which invokes the fifth function over the time keeper designated by the time keeper identifier;
   a tenth function which invokes the first function over the time keeper designated by the time keeper identifier; and
   an eleventh function which invokes the sixth function over the time keeper designated by the time keeper identifier.

5. The hard/soft cooperative verifying simulator according to claim 3, which is provided with a time keeper integrated module including:
   a seventh function which invokes the fourth function over a time keeper designated by a time keeper identifier;
   an eighth function which invokes the third function over the time keeper designated by the time keeper identifier;
   a ninth function which invokes the fifth function over the time keeper designated by the time keeper identifier;
   a tenth function which invokes the first function over the time keeper designated by the time keeper identifier; and
   an eleventh function which invokes the sixth function over the time keeper designated by the time keeper identifier.

6. The hard/soft cooperative verifying simulator according to claim 4, wherein each of the time keeper includes;
   a third variable indicating whether a state of a corresponding thread is in a sleep state or an operating state;
   a twelfth function which sets the third variable to the sleep state;
   a thirteenth function which sets the third variable to the operating state; and
   a fourteenth function which returns the third variable as a returned value.

7. The hard/soft cooperative verifying simulator according to claim 5, wherein each of the time keeper includes:
   a third variable indicating whether a state of a corresponding thread is in a sleep state or an operating state;
   a twelfth function which sets the third variable to the sleep state;
   a thirteenth function which sets the third variable to the operating state; and
   a fourteenth function which returns the third variable as a returned value.

8. The hard/soft cooperative verifying simulator according to claim 1, wherein the simulator body is a SystemC simulator body.

* * * * *